US012392286B2

(12) United States Patent
Yamarthi et al.

(10) Patent No.: US 12,392,286 B2
(45) Date of Patent: Aug. 19, 2025

(54) PUMP SYSTEMS HAVING DUAL-FUNCTION HEAT EXCHANGERS AND RELATED METHODS

(71) Applicant: General Electric Company, Schenectady, NY (US)

(72) Inventors: David Raju Yamarthi, Bengaluru (IN); Adam Joesph Wangler, Evendale, OH (US); Santosh Kumar Pattnaik, Bengaluru (IN); Brian G. Brzek, Niskayuna, NY (US); Ravindra Shankar Ganiger, Bengaluru (IN)

(73) Assignee: General Electric Company, Evendale, OH (US)

( * ) Notice: Subject to any disclaimer, the term of this patent is extended or adjusted under 35 U.S.C. 154(b) by 329 days.

(21) Appl. No.: 18/071,368

(22) Filed: Nov. 29, 2022

(65) Prior Publication Data
US 2024/0125271 A1    Apr. 18, 2024

(30) Foreign Application Priority Data

Oct. 17, 2022   (IN) .............................. 202211059127

(51) Int. Cl.
*F02C 7/14* (2006.01)
*F02C 9/00* (2006.01)
*H10N 10/13* (2023.01)

(52) U.S. Cl.
CPC .................. *F02C 7/14* (2013.01); *F02C 9/00* (2013.01); *H10N 10/13* (2023.02); *F05D 2220/36* (2013.01); *F05D 2260/213* (2013.01); *F05D 2270/303* (2013.01)

(58) Field of Classification Search
CPC ... F02C 7/14; F02C 9/00; H10N 10/13; F05D 2220/36; F05D 2260/213; F05D 2270/303
See application file for complete search history.

(56) References Cited

U.S. PATENT DOCUMENTS

| 2,932,953 | A | | 4/1960 | Becket et al. |
| 5,128,517 | A | * | 7/1992 | Bailey .................... G05D 23/20 |
| | | | | 219/490 |
| 5,711,155 | A | * | 1/1998 | DeVilbiss ............... F25B 21/02 |
| | | | | 62/434 |
| 6,986,647 | B2 | | 1/2006 | Jones et al. |
| 7,416,344 | B2 | | 8/2008 | Yamamoto et al. |

(Continued)

OTHER PUBLICATIONS

Pourkiaei et al., "Thermoelectric cooler and thermoelectric generator devices: A review of present and potential applications, modeling and materials", Abstract, Nov. 2019, 1 page.

*Primary Examiner* — Shafiq Mian
(74) *Attorney, Agent, or Firm* — Hanley, Flight & Zimmerman, LLC

(57) ABSTRACT

Example pump systems having dual-function annular heat exchangers are disclosed. An example pump system to pressurize a fluid within a closed loop transport bus includes a pump to move the fluid, a conduit in fluid connection with the pump, a heat exchanger positioned around at least a portion of the conduit, the heat exchanger to receive a first electrical signal transmitted in a first direction at a first time and a second electrical signal transmitted in a second direction at a second time different from the first time, the second direction opposite the first direction.

20 Claims, 17 Drawing Sheets

(56) References Cited

U.S. PATENT DOCUMENTS

| | | |
|---|---|---|
| 9,395,109 B2 | 7/2016 | Berger et al. |
| 9,816,735 B2 | 11/2017 | Fogelman et al. |
| 11,015,534 B2 | 5/2021 | Smith et al. |
| 2010/0011781 A1 | 1/2010 | Lents et al. |
| 2012/0017597 A1* | 1/2012 | Freund .................... F02C 7/143 |
| | | 60/39.181 |
| 2013/0049368 A1* | 2/2013 | Kaufmann .............. F03G 6/067 |
| | | 290/52 |
| 2016/0298498 A1* | 10/2016 | Kreuger .................. F03G 6/068 |
| 2021/0340914 A1 | 11/2021 | Niergarth et al. |

* cited by examiner

PUMP SYSTEMS HAVING DUAL-FUNCTION HEAT EXCHANGERS AND RELATED METHODS

RELATED APPLICATION

This patent claims the benefit of Indian Provisional Patent Application No. 202211059127, which was filed on Oct. 17, 2022. Indian Provisional Patent Application No. 202211059127 is hereby incorporated herein by reference in its entirety. Priority to Indian Provisional Patent Application No. 202211059127 is hereby claimed.

FIELD OF THE DISCLOSURE

This disclosure relates generally to fluid pumps and, more particularly, to pump systems that provide heating and cooling functionality.

BACKGROUND

Aircraft typically include various accessory systems supporting the operation of the aircraft and/or its gas turbine engine(s). For example, such accessory systems may include a lubrication system that lubricates components of the engine(s), an engine cooling system that provides cooling air to engine components, an environmental control system that provides cooled air to the cabin of the aircraft, and/or the like. As such, heat is added or removed from a fluid (e.g., oil, air, etc.) during operation of these accessory systems.

BRIEF DESCRIPTION OF THE DRAWINGS

In general, the same reference numbers will be used throughout the drawing(s) and accompanying written description to refer to the same or like parts. The figures are not to scale.

DETAILED DESCRIPTION

Figure 1:
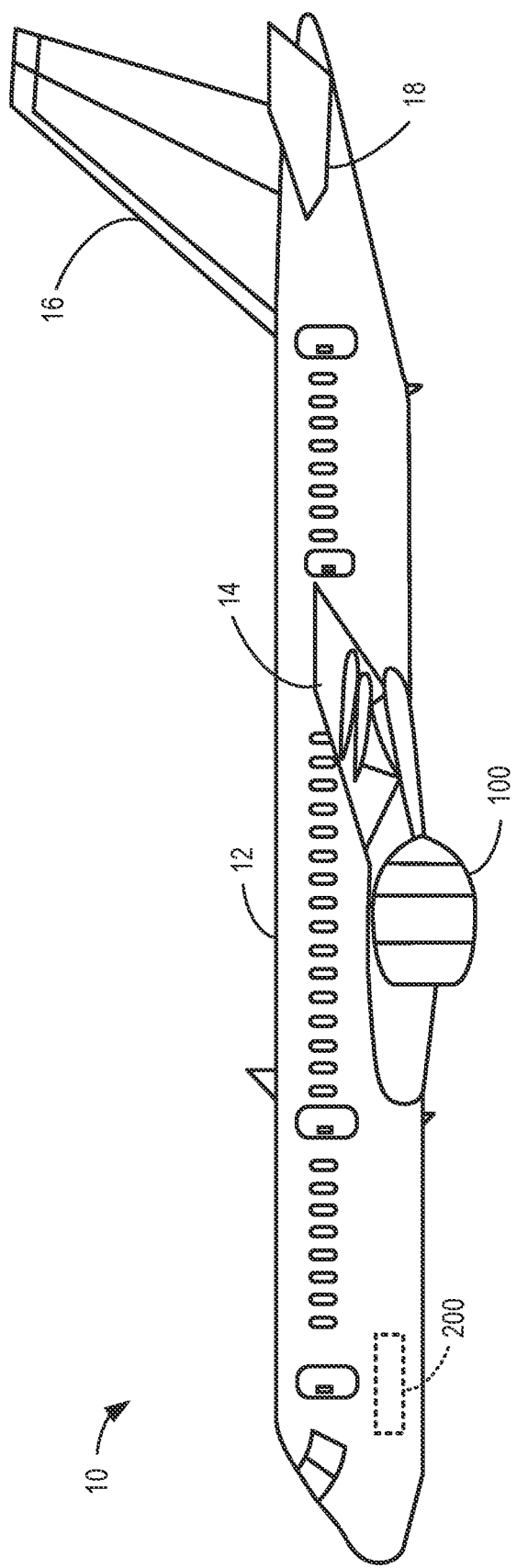
FIG. 1 is a side view of an example aircraft.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

As used herein, unless otherwise stated, the term "above" describes the relationship of two parts relative to Earth. A first part is above a second part if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this application, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a ten percent margin.

The terms "forward" and "aft" refer to relative positions within a gas turbine engine, pump, or vehicle, and refer to the normal operational attitude of the gas turbine engine, pump, or vehicle. For example, with regard to a gas turbine engine, forward refers to a position closer to an engine inlet and aft refers to a position closer to an engine nozzle or exhaust. Further, with regard to a pump, forward refers to a position closer to a pump inlet and aft refers to a position closer to an end of the pump opposite the inlet.

The terms "upstream" and "downstream" refer to the relative direction with respect to a flow in a pathway. For example, with respect to a fluid flow, "upstream" refers to the direction from which the fluid flows, and "downstream" refers to the direction to which the fluid flows.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including a plurality of types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the a plurality of types of the processing circuitry is/are best suited to execute the computing task(s).

As used herein, stating that any part is "annular" encompasses the part having an inner perimeter that extends at least 180 degrees)(° around a region (e.g., another part, a space, etc.) that borders the inner perimeter. For example, when an annular part is positioned around another part, the annular part extends at least halfway around the perimeter of the other part. Moreover, an "annular" part may have a perimeter that is defined by a shape other than a circle or partial circle (e.g., an arc or curve). For example, the "annular" part may have faces or edges that conform with the region to be in contact with and/or surrounded by the "annular" part.

Centrifugal fluid pumps move fluid through systems by converting rotational kinetic energy of an impeller to hydrodynamic energy of a flowing fluid. In other words, the angular velocity of the impeller is directly proportional to the flow rate of the flowing fluid exiting the pump. The impeller is provided a change in rotational kinetic energy from an electric motor applying mechanical work to an impeller shaft coupled to the impeller and to the rotor of the electric motor. The rotor is provided a change in mechanical work over a period of time (i.e., mechanical power) from a stator in the electric motor applying electromagnetic forces to the rotor in the form of torque. If the motor supplies a constant amount of electrical energy to the stator, then the rotor will supply a constant amount of mechanical energy to the impeller. In this case, the mechanical power supplied to the pump by the electric motor would be equal to the quotient of the rotational kinetic energy and the amount of time the power is being supplied. In rotational systems, such as a centrifugal fluid pump, the mechanical power of the impeller is equal to the product of the torque and the angular velocity. When the rotor of the electric motor and the impeller shaft of the centrifugal fluid pump are coupled axially, the torque and angular velocity of the rotor transfers to the impeller. Such centrifugal pumps can be utilized to drive a heat exchange fluid through a thermal transport bus to maintain working fluids and/or components of a system within a certain temperature range.

Conventional thermal transport systems utilize a centrifugal pump that drives the heat exchange fluid through one or more heat sink or source heat exchangers to control the thermal energy within the system. Accordingly, the thermal transport bus can carry the heat exchange fluid to components of a system that need to be cooled or heated for certain operations. However, heat source heat exchangers and heat sink heat exchangers take up a significant amount of space and are costly to implement in the system. Moreover, a typical heat exchange fluid is supercritical carbon dioxide, which needs to be maintained within a certain temperature range and a certain pressure range to avoid a phase change (e.g., to a liquid state, a gaseous state, or a solid state). Accordingly, during startup operations, the thermal transport system faces the risk of the supercritical carbon dioxide being cooled (e.g., by ambient air), which can convert the supercritical carbon dioxide to a liquid state.

Additionally, components of the centrifugal pump can overheat during an extended period of operations, which can damage the pump and/or reduce a rate at which the centrifugal pump is able to drive the heat exchange fluid. For instance, a secondary flow is often required in centrifugal pumps to balance pressure and/or cool pump components. However, when the heat exchange fluid in the secondary flow has an increased temperature, the pump can encounter higher vibrations that hinder the pump performance and/or damage pump components. As such, pumps often require larger bearings to support the forces that are encountered when operating at increased temperatures.

Examples of heat exchange systems disclosed herein include dual-function secondary flow heat exchangers that supply thermal energy to, or extract thermal energy from, a fluid based on a temperature and/or a pressure of the fluid. For example, during startup operations, the dual-function secondary flow heat exchangers can heat the fluid to help prevent the fluid from encountering a phase change. Furthermore, subsequent to the startup operations, the dual-function secondary flow heat exchangers can cool the fluid to help reduce vibrations encountered by the pump, improve a stability and reliability of the pump, and prevent the pump from overheating while maintaining the fluid within certain temperature and pressure ranges for an optimal, or otherwise improved, thermal energy transfer. Moreover, the dual-function secondary flow heat exchangers can reduce costs associated with a heat exchange system as both heating and cooling are provided by a single heat exchanger.

The dual-function secondary flow heat exchangers can be implemented by one or more annular thermoelectric modules (e.g., thermoelectric coolers) that is/are positioned around a secondary flow feedback conduit. An annular thermoelectric module includes an annular inner housing, an annular outer housing positioned around the annular inner housing, and junctions positioned between the annular inner housing and the annular outer housing. The junctions include metal plates to electrically couple N-type semiconductors to P-type semiconductors and separate the semiconductors from the annular inner and outer housings.

The inner annular housing and the outer annular housing include a ceramic material, cobalt, and/or cerium-palladium to help thermal energy from the junctions travel through the housings while providing electrical insulation for the junctions. The annular inner housing is in contact with an exterior surface of the secondary flow feedback conduit. For example, the annular inner housing can circumferentially surround the secondary flow feedback conduit. In some examples, the annular thermoelectric module includes inner fins (e.g., inner protrusions, knobs, bulges, etc.) that extend centripetally from the inner annular housing. For example, the inner fins can extend past an outer diameter of the secondary flow feedback conduit and increase a surface area across which thermal energy can be transferred between the annular thermoelectric module and the secondary flow feedback conduit. Similarly, the annular thermoelectric module can include outer fins that extend radially outward from the annular outer housing and increase a surface area across which thermal energy can be transferred between the annular thermoelectric module and air flowing around the thermoelectric module.

In certain examples, processor circuitry associated with the annular thermoelectric module causes an electrical signal to flow through the annular thermoelectric module in a first direction at a first time (e.g., during startup operations) and in a second direction (e.g., a direction opposite the first direction) at a second time based on the temperature and/or the pressure of the fluid. That is, the processor circuitry causes the electrical signal to flow through the annular thermoelectric module in the first direction to increase a thermal energy of the fluid in response to a temperature of the fluid not satisfying (e.g., being less than, being less than or equal to) a temperature threshold and/or a pressure of the fluid not satisfying (e.g., being less than, being less than or equal to) a pressure threshold. Conversely, the processor circuitry causes the electrical signal to flow through the annular thermoelectric module in the second direction to reduce the thermal energy of the fluid in response to the temperature of the fluid satisfying (e.g., being greater than, being greater than or equal to) the temperature threshold and/or the pressure of the fluid satisfying (e.g., being greater than, being greater than or equal to) the pressure threshold. Specifically, when electric current passes through the junctions in the annular thermoelectric module in the first direction, the junctions cause a temperature of the inner annular housing to increase and cause a temperature of the outer annular housing to decrease. On the other hand, when the electric current passes through the junctions in the second direction, the junctions cause the temperature of the outer annular housing to increase and cause the temperature of the inner annular housing to decrease.

The secondary flow conduit can be in fluid connection with (e.g., fluidly coupled to) an input conduit that provides the fluid to a pump and/or an output conduit that carries the fluid driven by the pump. The input conduit can be in fluid connection with the secondary flow conduit and a first inlet of the pump. The output conduit can be in fluid connection with the secondary flow conduit and an outlet of the pump. Further, the secondary flow conduit can be in fluid connection with a second inlet of the pump in addition to the input conduit and/or the output conduit. Thus, the secondary flow conduit defines a flow path for the fluid to flow from the input conduit and/or the output conduit into the pump through the second inlet. In some examples, the second inlet is defined in a motor and/or bearing housing of the pump.

In certain examples, a sensor including reduced graphene oxide (rGO) nanosheets is positioned between the annular thermoelectric module and the pump. Advantageously, the rGO sensor has an electrical conductivity that corresponds with a temperature of the fluid encountered by the rGO sensor. That is, the electrical conductivity of the rGO sensor increases with a temperature increase and decreases with a temperature decrease. In certain examples, the processor circuitry can transmit an electrical signal to the rGO sensor, which is impacted by the electrical conductivity of the rGO sensor. In turn, the electrical signal can be delivered to the processor circuitry, which can determine a temperature of the heat exchange fluid based on a change in the electrical signal.

In some examples, the rGO sensor is electrically in series with an electric power source, which can be implemented by the processor circuitry, and the annular thermoelectric module. As such, the rGO sensor can receive an electrical signal from the power source in advance of the electrical signal reaching the annular thermoelectric module when the signal is transmitted in the second direction. Accordingly, when the rGO sensor encounters a reduction in the temperature of the heat exchange fluid, the rGO sensor possesses a reduced electrical conductivity (e.g., an increased electrical resistance) and reduces an electrical power of the electrical signal received by the annular thermoelectric module. As a result, the reduction in the electrical power of the electrical signal causes a temperature of the inner annular housing of the annular thermoelectric module to increase and, thus, reduces an amount of thermal energy that the annular thermoelectric module extracts from the fluid flowing into the pump through the second inlet. Conversely, when the rGO sensor encounters an increase in the temperature of the fluid, the rGO sensors exhibits an increased conductivity that causes the annular thermoelectric module to receive an increase in electrical power. Accordingly, the increase in the electrical power provided by the electrical signal flowing in the second direction causes the temperature of the inner annular housing to decrease and, thus, causes the annular thermoelectric module to extract more heat from the fluid.

In some other examples, another type of temperature sensor and/or a pressure sensor can measure the temperature and/or the pressure, respectively, of the fluid between the annular thermoelectric module and the second inlet. In such examples, the processor circuitry can adjust the electrical power of the electrical signal received by the annular thermoelectric module based on the temperature and/or the pressure measured by the temperature sensor and/or the pressure sensor.

In certain examples, a first flow metering valve can be positioned between the input conduit and the secondary flow conduit and/or a second flow metering valve can be positioned between the output conduit and the secondary flow conduit. In such examples, the processor circuitry can adjust a position(s) of the first metering valve and/or the second metering valve based on the temperature and/or the pressure of the fluid. For example, the processor circuitry can cause the first flow metering valve to open and/or cause the second flow metering to close in response to the temperature of the fluid not satisfying (e.g., being less than, being less than or equal to) a temperature threshold. As a result, the processor circuitry causes the fluid to encounter the annular thermoelectric module sooner and, thus, enables the annular thermoelectric module to transfer thermal energy to the fluid earlier, which can help maintain the fluid in a certain state or phase (e.g., maintain supercritical carbon dioxide (sCO2) in a supercritical state).

Furthermore, the processor circuitry can cause the first flow metering valve to close and/or cause the second flow metering to open in response to the temperature of the fluid satisfying (e.g., being greater than, being greater than or equal to) the temperature threshold. As such, the annular thermoelectric module can cool the fluid in advance of the fluid encountering the pump components, which cools the pump components and improves pump performance. Additionally, the cooled fluid can eventually mix with the fluid entering the pump through the first inlet to reduce a temperature of the fluid driven out of the pump and, thus, increase thermal energy absorption from downstream components and/or working fluids.

In some examples, the first flow metering valve and the second flow metering valve are both open at the same time to enable the annular thermoelectric module to heat or cool more of the fluid for rapid temperature and/or pressure adjustments. Thus, the fluid can be selectively routed to the pump for optimal, or otherwise improved, thermal energy exchange with components (e.g., pump components, engine components, etc.) and/or working fluids (e.g., fuel, air, etc.).

For the figures disclosed herein, identical numerals indicate the same elements throughout the figures. Referring now to the drawings, FIG. 1 is a side view of an aircraft 10 in which examples disclosed herein can be implemented. As shown, in several examples, the aircraft 10 includes a fuselage 12 and a pair of wings 14 (one is shown) extending outward from the fuselage 12. In the illustrated example, a gas turbine engine 100 is supported on each wing 14 to propel the aircraft through the air during flight. Additionally, as shown, the aircraft 10 includes a vertical stabilizer 16 and a pair of horizontal stabilizers 18 (one is shown). However, in alternative examples, the aircraft 10 may include any other suitable configuration, such as any other suitable number or type of engines.

Furthermore, the aircraft 10 may include a thermal management system 200 for transferring heat between fluids that support the operation of the aircraft 10. More specifically, the aircraft 10 may include one or more accessory systems configured to support the operation of the aircraft 10. For example, in some examples, such accessory systems include a lubrication system that lubricates components of the gas turbine engine 100, a cooling system that provides cooling air to components of the gas turbine engine 100, an environmental control system that provides cooled air to the cabin of the aircraft 10, and/or the like. In such examples, the thermal management system 200 is configured to transfer heat to and/or from one or more fluids supporting the operation of the aircraft 10 (e.g., the oil of the lubrication system, the air of the cooling system and/or the environmental control system, and/or the like) from and/or to one or more other fluids supporting the operation of the aircraft 10 (e.g., the fuel supplied to the gas turbine engine 100). However, in alternative examples, the thermal management system 200 may be configured to transfer heat between any other suitable fluids supporting the operation of the aircraft 10.

The configuration of the aircraft 10 described above and shown in FIG. 1 is provided to place the present subject matter in an example field of use. Thus, the present subject matter may be readily adaptable to any manner of aircraft and/or any other suitable heat transfer application.

Figure 2:
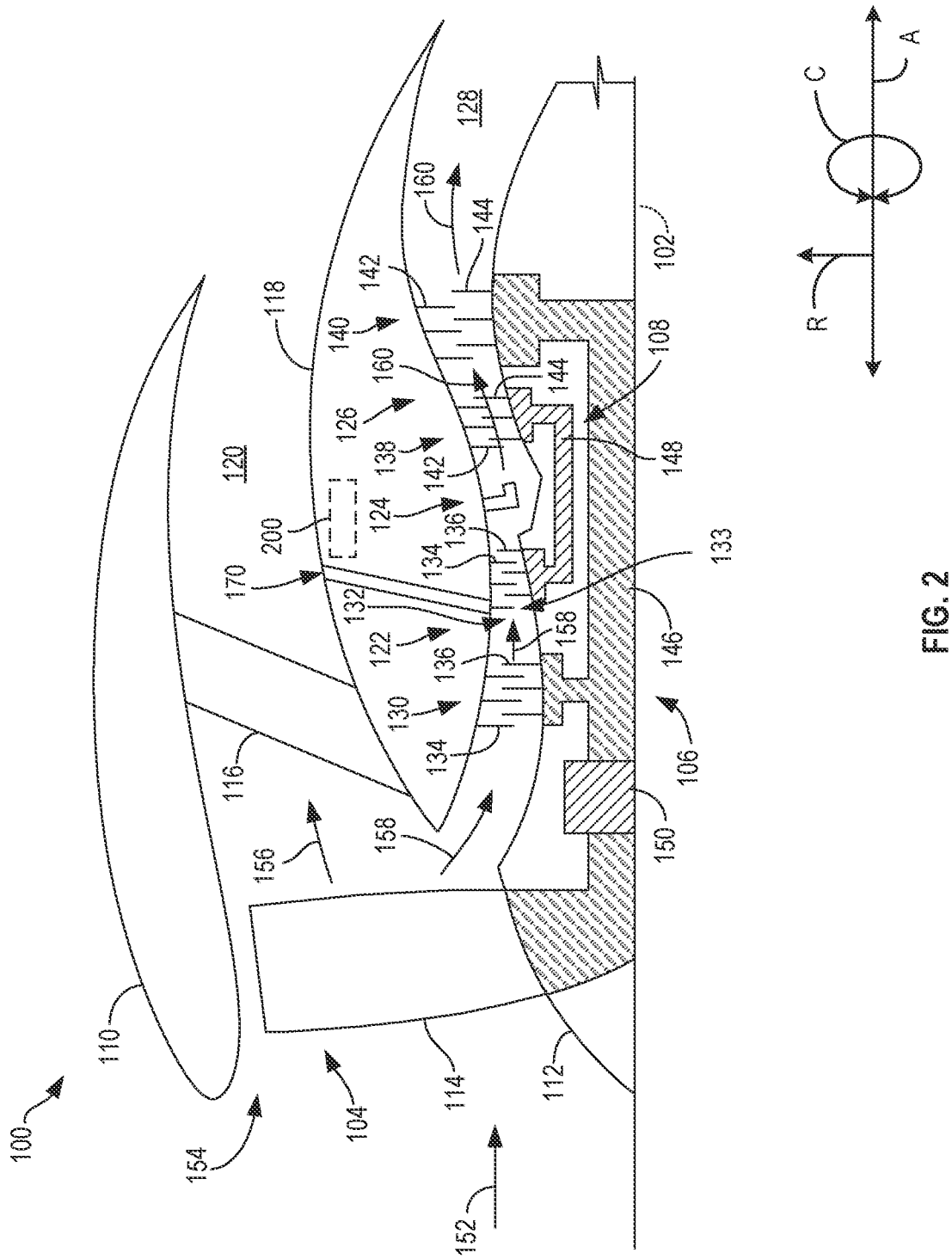
FIG. 2 is a schematic cross-sectional view of an example gas turbine engine of an aircraft.

FIG. 2 is a schematic cross-sectional view of one example of a gas turbine engine 100 in which examples disclosed herein can be implemented. In the illustrated example, the gas turbine engine 100 is configured as a high-bypass turbofan engine. However, in alternative examples, the gas turbine engine 100 may be configured as a propfan engine, a turbojet engine, a turboprop engine, a turboshaft gas turbine engine, or any other suitable type of gas turbine engine.

In general, the gas turbine engine 100 extends along an axial centerline 102 and includes a fan 104, a low-pressure (LP) spool 106, and a high pressure (HP) spool 108 at least partially encased by an annular nacelle 110. More specifically, the fan 104 may include a fan rotor 112 and a plurality of fan blades 114 (one is shown) coupled to the fan rotor 112. In this respect, the fan blades 114 are circumferentially spaced apart and extend radially outward from the fan rotor 112. Moreover, the LP and HP spools 106, 108 are positioned downstream from the fan 104 along the axial centerline 102. As shown, the LP spool 106 is rotatably coupled to the fan rotor 112, thereby permitting the LP spool 106 to rotate the fan blades 114. Additionally, a plurality of outlet guide vanes or struts 116 circumferentially spaced apart from each other and extend radially between an outer casing 118 surrounding the LP and HP spools 106, 108 and the nacelle 110. As such, the struts 116 support the nacelle 110 relative to the outer casing 118 such that the outer casing 118 and the nacelle 110 define a bypass airflow passage 120 positioned therebetween.

The outer casing 118 generally surrounds or encases, in serial flow order, a compressor section 122, a combustion section 124, a turbine section 126, and an exhaust section 128. In some examples, the compressor section 122 may include a low-pressure (LP) compressor 130 of the LP spool 106 and a high-pressure (HP) compressor 132 of the HP spool 108 positioned downstream from the LP compressor 130 along the axial centerline 102. Each compressor 130, 132 may, in turn, include one or more rows of stator vanes 134 interdigitated with one or more rows of compressor rotor blades 136. As such, the compressors 130, 132 define a compressed air flow path 133 extending therethrough. Moreover, in some examples, the turbine section 126 includes a high-pressure (HP) turbine 138 of the HP spool 108 and a low-pressure (LP) turbine 140 of the LP spool 106 positioned downstream from the HP turbine 138 along the axial centerline 102. Each turbine 138, 140 may, in turn, include one or more rows of stator vanes 142 interdigitated with one or more rows of turbine rotor blades 144.

Additionally, the LP spool 106 includes the low-pressure (LP) shaft 146 and the HP spool 108 includes a high pressure (HP) shaft 148 positioned concentrically around the LP shaft 146. In such examples, the HP shaft 148 rotatably couples the turbine rotor blades 144 of the HP turbine 138 and the compressor rotor blades 136 of the HP compressor 132 such that rotation of the turbine rotor blades 144 of the HP turbine 138 rotatably drives the compressor rotor blades 136 of the HP compressor 132. As shown in the example of FIG. 2, the LP shaft 146 is directly coupled to the turbine rotor blades 144 of the LP turbine 140 and the compressor rotor blades 136 of the LP compressor 130. Furthermore, the LP shaft 146 is coupled to the fan 104 via a gearbox 150. In this respect, the rotation of the turbine rotor blades 144 of the LP turbine 140 rotatably drives the compressor rotor blades 136 of the LP compressor 130 and the fan blades 114.

In some examples, the gas turbine engine 100 generates thrust to propel an aircraft (e.g., the aircraft 10 of FIG. 1, etc.). More specifically, during operation, air (indicated by arrow 152) enters an inlet portion 154 of the gas turbine engine 100. The fan 104 supplies a first portion (indicated by arrow 156) of the air 152 to the bypass airflow passage 120 and a second portion (indicated by arrow 158) of the air 152 to the compressor section 122. The second portion 158 of the air 152 first flows through the LP compressor 130 in which the compressor rotor blades 136 therein progressively compress the second portion 158 of the air 152. Next, the second portion 158 of the air 152 flows through the HP compressor 132 in which the compressor rotor blades 136 therein continue to progressively compress the second portion 158 of the air 152. The compressed second portion 158 of the air 152 is subsequently delivered to the combustion section 124. In the combustion section 124, the second portion 158 of the air 152 mixes with fuel and burns to generate high-temperature and high-pressure combustion gases 160. Thereafter, the combustion gases 160 flow through the HP turbine 138 which the turbine rotor blades 144 of the HP turbine 138 extract a first portion of kinetic and/or thermal energy therefrom. This energy extraction rotates the HP shaft 148, thereby driving the HP compressor 132. The combustion gases 160 then flow through the LP turbine 140 in which the turbine rotor blades 144 of the LP turbine 140 extract a second portion of kinetic and/or thermal energy therefrom. This energy extraction rotates the LP shaft 146, thereby driving the LP compressor 130 and the fan 104 via the gearbox 150. The combustion gases 160 then exit the gas turbine engine 100 through the exhaust section 128.

As mentioned above, the aircraft 10 may include a thermal management system 200 for transferring heat between fluids supporting the operation of the aircraft 10. In this respect, the thermal management system 200 may be positioned within the gas turbine engine 100. For example, as shown in FIG. 2, the thermal management system 200 is positioned within the outer casing 118 of the gas turbine engine 100. However, in alternative examples, the thermal management system 200 may be positioned at any other suitable location within the gas turbine engine 100.

Furthermore, in some examples, the gas turbine engine 100 defines a third-stream flow path 170. In general, the third-stream flow path 170 extends from the compressed air flow path 133 defined by the compressor section 122 to the bypass airflow passage 120. In this respect, the third-stream flow path 170 allows compressed a portion of the compressed air 158 from the compressor section 122 to bypass the combustion section 124. More specifically, in some examples, the third-stream flow path 170 may define a concentric or non-concentric passage relative to the compressed air flow path 170 downstream of one or more of the compressors 130, 132 or the fan 104. The third-stream flow path 170 may be configured to selectively remove a portion of compressed air 158 from the compressed air flow path 170 via one or more variable guide vanes, nozzles, or other actuation systems.

In addition, as will be described below, the thermal management system 200 helps control thermal energy encountered by the gas turbine engine 100. For example, the thermal management system 200 can transfer heat to the fuel to be provided to the combustion section 124, the air flowing through the third-stream flow path 170, the outer casing 118, and/or any other component associated with the gas turbine engine 100. Furthermore, the thermal management system 200 can extract heat from working fluids and/or engine components. However, a temperature, a pressure, and/or a flow rate of a fluid (e.g., a heat exchange fluid such as a supercritical fluid (e.g., $sCO_2$, etc.)) within the thermal management system 200 limits a rate at which thermal energy is transferred between the heat exchange fluid and the fuel, the air, and/or the engine components. Additionally, it is advantageous for the thermal management system 200 to produce the pressure and/or the flow rate with components (e.g., pump systems) that minimize and/or otherwise reduce a physical size of the thermal management system 200 and/or the components (e.g., pump systems) included therein. Moreover, the thermal management system 200 may ensure that the heat exchange fluid is free of contaminants when thermal energy is to be transferred.

The configuration of the gas turbine engine 100 described above and shown in FIG. 2 is provided to place the present subject matter in an example field of use. Thus, the present subject matter may be readily adaptable to any manner of gas turbine configuration, including other types of aviation-based gas turbine engines, marine-based gas turbine engines, and/or land-based/industrial gas turbines.

Figure 3A:
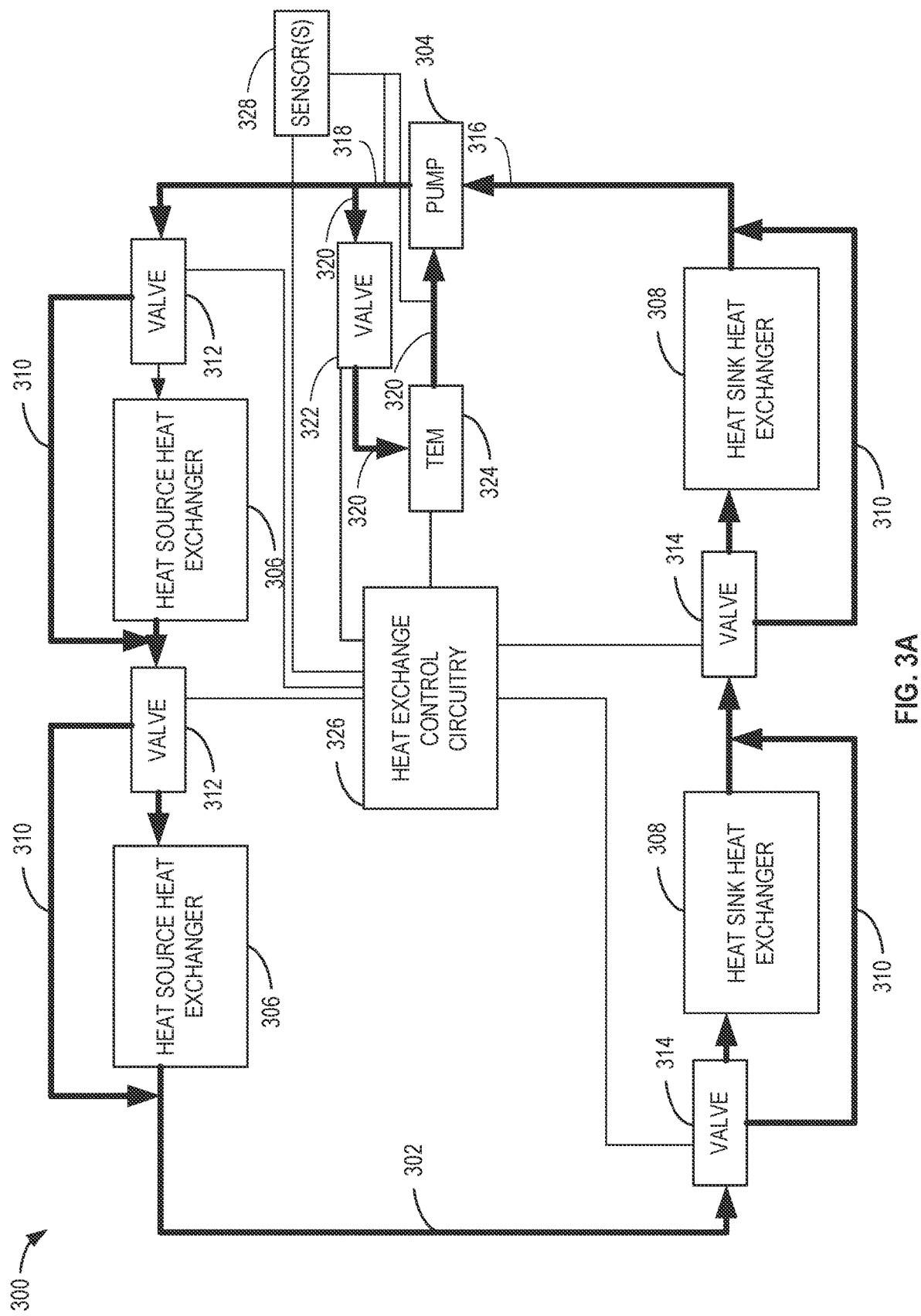
FIG. 3A is a schematic diagram of an example thermal management system for transferring heat between fluids.

FIG. 3A is a schematic view of a first example implementation of a thermal management system 300 (e.g., the thermal management system 200 of FIGS. 1 and 2) for transferring heat between fluids. In general, the thermal management system 300 will be discussed in the context of the aircraft 10 and the gas turbine engine 100 described above and shown in FIGS. 1 and 2. However, the disclosed thermal management system 300 may be implemented within any aircraft having any other suitable configuration, any gas turbine engine having any other suitable configuration, and/or any other system in which thermal management is desired.

As shown, the thermal management system 300 includes a thermal transport bus 302 (e.g., a closed loop transport bus). Specifically, in several examples, the thermal transport bus 302 is configured as one or more fluid conduits (e.g., pipes, tubes, ducts, etc.) through which a fluid (e.g., a heat exchange fluid) flows. As will be described below, the heat exchange fluid flows through various heat exchangers such that heat is added to and/or removed from the heat exchange fluid. In this respect, the heat exchange fluid may be any suitable fluid, such as sCO2, hydrogen, helium, a mixture of helium and an inert gas, etc. Moreover, the thermal management system 300 includes a pump 304 configured to pump the heat exchange fluid through the thermal transport bus 302.

Additionally, the thermal management system 300 includes one or more heat source heat exchangers 306 arranged along the thermal transport bus 302. More specifically, the heat source heat exchanger(s) 306 is/are fluidly coupled to the thermal transport bus 302 such that the heat exchange fluid flows through the heat source heat exchanger(s) 306. In this respect, the heat source heat exchanger(s) 306 is/are configured to transfer heat from fluids supporting the operation of the aircraft 10 and/or the gas turbine engine 100 to the heat exchange fluid, thereby cooling the fluids supporting the operation of the aircraft 10 and/or the gas turbine engine 100. Thus, the heat source heat exchanger(s) 306 adds heat to the heat exchange fluid. Although FIG. 3A illustrates two heat source heat exchangers 306, the thermal management system 300 may include a single heat source heat exchanger 306 or three or more heat source heat exchangers 306.

The heat source heat exchanger(s) 306 may correspond to any suitable heat exchanger(s) that cool a fluid supporting the operation of the aircraft 10 and/or the gas turbine engine 100. For example, at least one of the heat exchangers 306 can be a heat exchanger(s) of a lubrication system(s) of the gas turbine engine 100. In such an example, this heat exchanger(s) 306 transfers heat from the oil lubricating the gas turbine engine to the heat exchange fluid. In another example, at least one of the heat exchangers 306 is a heat exchanger(s) of the cooling system of the engine(s) 100. In such an example, this heat exchanger(s) 306 transfers heat from the cooling air bled from the compressor section(s) 122 (or a compressor discharge plenum) of the gas turbine engine 100 to the heat exchange fluid. However, in alternative examples, the heat source heat exchanger(s) 306 may correspond to any other suitable heat exchangers that cool a fluid supporting the operation of the aircraft 10 and/or the gas turbine engine 100.

Furthermore, the thermal management system 300 includes a plurality of heat sink heat exchangers 308 arranged along the thermal transport bus 302. More specifically, the heat sink heat exchangers 308 are fluidly coupled to the thermal transport bus 302 such that the heat exchange fluid flows through the heat sink heat exchangers 308. In this respect, the heat sink heat exchangers 308 are configured to transfer heat from the heat exchange fluid to other fluids supporting the operation of the aircraft 10 and/or the gas turbine engine 100, which heats the other fluids supporting the operation of the aircraft 10 and/or the gas turbine engine 100. Thus, the heat sink heat exchangers 308 remove heat from the heat exchange fluid. Although FIG. 3A illustrates two heat sink heat exchangers 308, the thermal management system 300 may include one heat sink heat exchanger 308 or three or more heat sink heat exchangers 308.

The heat sink heat exchangers 308 may correspond to one or more heat exchangers that heat a fluid supporting the operation of the aircraft 10 and/or the gas turbine engine 100. For example, at least of one of the heat exchangers 308 is a heat exchanger(s) of the fuel system(s) of the engine(s) 100. In such an example, the fuel system heat exchanger(s) 308 transfers heat from the heat exchange fluid to the fuel supplied to the gas turbine engine 100. In another example, at least one of the heat exchangers 308 is a heat exchanger(s) in contact with the air 156 flowing through the bypass airflow passage(s) 120 of the gas turbine engine 100. In such an example, this heat exchanger(s) 308 transfers heat from the heat exchange fluid to the air 156 flowing through the bypass airflow passage(s) 120.

In some examples, one or more of the heat exchangers 308 are configured to transfer heat to the air flowing through the third-stream flow path 170. In such examples, the heat exchanger(s) 308 is in contact with the air flow through the third-stream flow path 170. Thus, heat from the heat exchange fluid flowing through the thermal transport bus 302 may be transferred to the air flow through the third-stream flow path 170. The use of the third-stream flow path 170 as a heat sink for the thermal management system 300 provides one or more technical advantages. For example, the third-stream flow path 170 provides greater cooling than other sources of bleed air because a larger volume of air flows through the third-stream flow path 170 than other bleed air flow paths. Moreover, the air flowing through third-stream flow path 170 is cooler than the air flowing through other bleed air flow paths and the compressor bleed air. Additionally, the air in the third-stream flow path 170 is pressurized, thereby allowing the heat exchanger(s) 308 to be smaller than heat exchangers relying on other heat sinks within the engine. Furthermore, in examples in which the gas turbine engine 100 is unducted, using the third-stream flow path 170 as a heat sink does not increase drag on the gas turbine engine 100 unlike the use of ambient air (e.g., a heat exchanger in contact with air flowing around the gas turbine engine 100). However, in alternative examples, the heat sink heat exchangers 308 may correspond to any other suitable heat exchangers that heats a fluid supporting the operation of the aircraft 10 and/or the gas turbine engine 100.

Moreover, in several examples, the thermal management system 300 includes one or more bypass conduits 310. Specifically, as shown, each bypass conduit 310 is fluidly coupled to the thermal transport bus 302 such that the bypass conduit 310 allows at least a portion of the heat exchange fluid to bypass one of the heat exchangers 306, 308. In some examples, the heat exchange fluid bypasses one or more of the heat exchangers 306, 308 to adjust the temperature of the heat exchange fluid within the thermal transport bus 302. The flow of example heat exchange fluid through the bypass conduit(s) 310 is controlled to regulate the pressure of the heat exchange fluid within the thermal transport bus 302. In the illustrated example of FIG. 3A, each heat exchanger 306, 308 has a corresponding bypass conduit 310. However, in alternative examples, any number of heat exchangers 306, 308 may have a corresponding bypass conduit 310 as long as there is at least one bypass conduit 310.

Additionally, in some examples, the thermal management system 300 includes one or more heat source bypass valves 312 and one or more heat sink bypass valves 314. In general, each heat source bypass valve 312 is configured to control the flow of the heat exchange fluid through a bypass conduit 310 that bypasses a heat source heat exchanger 306. Similarly, each heat sink bypass valve 314 is configured to control the flow of the heat exchange fluid through a bypass conduit 310 that bypasses a heat sink heat exchanger 308. In this respect, each bypass valve 312, 314 is fluidly coupled to the thermal transport bus 302 and a corresponding bypass conduit 310. As such, each bypass valve 312, 314 may be moved between fully and/or partially opened and/or closed positions to selectively occlude the flow of heat exchange through its corresponding bypass conduit 310.

The bypass valves 312, 314 are controlled based on the pressure of the heat exchange fluid within the thermal transport bus 302. More specifically, as indicated above, in certain instances, the pressure of the heat exchange fluid flowing through the thermal transport bus 302 may fall outside of a desired pressure range. When the pressure of the heat exchange fluid is too high, the thermal management system 300 may incur accelerated wear. In this respect, when the pressure of the heat exchange fluid within the thermal transport bus 302 exceeds a maximum or otherwise increased pressure value, one or more heat source bypass valves 312 open. In such instances, at least a portion of the heat exchange fluid flows through the bypass conduits 310 instead of the heat source heat exchanger(s) 306. Thus, less heat is added to the heat exchange fluid by the heat source heat exchanger(s) 306, thereby reducing the temperature and, thus, the pressure of the fluid.

In some examples, the maximum pressure value is set prior to and/or during operation based on parameters (e.g., materials utilized, pump 304 design, aircraft 10 design, gas turbine engine 100 design, heat exchange fluid, etc.) associated with the thermal management system 300. The example maximum pressure value can be adjusted relative to the pressure capacities of the thermal transport bus 302, the pump 304, the heat exchangers 306, 308, the bypass conduit(s) 310, and/or the bypass valves 312, 314. Some examples of pump 304 architecture that influence example maximum pressure capacities are described in greater detail below.

Conversely, when the pressure of the heat exchange fluid is too low, the pump 304 may experience operability problems and increased wear. As such, when the pressure of the heat exchange fluid within the thermal transport bus falls below a minimum or otherwise reduced pressure value, one or more heat sink bypass valves 314 open. In such instances, at least a portion of the heat exchange fluid flows through the bypass conduits 310 instead of the heat sink heat exchangers 308. Thus, less heat is removed from the heat exchange fluid by the heat sink heat exchangers 308, which increase the temperature and, thus, the pressure of the fluid. In several examples, the minimum pressure value is 1070 pounds per square inch or more. In some examples, the minimum pressure value is between 1150 and 1350 pounds per square inch, such as 1250 pounds per square inch. In other examples, the minimum pressure value is between 2400 and 2600 pounds per square inch, such as 2500 pounds per square inch. Such minimum pressure values are generally utilized when the heat exchange fluid is in a supercritical state (e.g., when the heat exchange fluid is carbon dioxide).

As such, the thermal management system 300 may be configured to operate such that the pressure of the heat transport fluid is maintained within a range extending between the minimum and maximum pressure values. In some examples, the range extends from 1070 to 4000 pounds per square inch. Specifically, in one example, the range extends from 1250 to 1400 pounds per square inch. In another example, range extends from 2500 to 2800 pounds per square inch.

In some examples, the thermal management system 300 includes one pump 304 or a plurality of pumps 304 depending on the desired flow rate, difference in pressure across the pump 304, and/or the kinetic energy loss of the heat exchange fluid in the thermal transport bus 302. For example, the pump 304 may increase the output pressure head to accelerate the flow of the heat exchange fluid to a first flowrate. As the heat exchange fluid passes through the thermal transport bus 302, the example kinetic energy of the heat exchange fluid dissipates due to friction, temperature variations, etc. Due to the kinetic energy losses, the heat exchange fluid decelerates to a second flow rate at some point upstream of the pump 304. If the example second flow rate is below a desired operating flow rate of the heat exchange fluid, then the pump 304 can either be of a different architecture that outputs a higher first flow rate, or one or more additional pumps 304 can be included in the thermal management system 300.

To transport the heat exchange fluid to the pump 304, the thermal transport bus 302 includes an input conduit 316 in fluid connection with a first inlet of the pump 304. Further, to deliver the driven heat exchange fluid to the heat source heat exchangers 306 and/or the heat sink heat exchangers 308, the thermal transport bus 302 includes an output conduit 318 in fluid connection with an outlet of the pump 304. As such, the pump 304 can receive the heat exchange fluid through the first inlet in fluid connection with the thermal transport bus 302 and drive the heat exchange fluid through the outlet in fluid connection with the thermal transport bus 302.

In the illustrated example of FIG. 3A, the thermal transport bus 302 includes a feedback conduit 320 disposed between and fluidly coupling the output conduit 318 to a second inlet of the pump 304. Additionally or alternatively, the feedback conduit 320 can fluidly couple the input conduit 316 to the second inlet of the pump 304, as discussed further in association with FIGS. 3B, 3C, 4A, 4B, and 4C. Specifically, the feedback conduit 320 delivers the heat exchange fluid to a body of the pump 304 to help balance a pressure of the pump 304, cool components of the pump 304, and/or provide lubrication between rotating parts and bearings within the pump 304 (e.g., hydrostatic gas foil bearing, a foil-air bearing, a fluid bearing, etc.). Further, the thermal management system 200 includes a feedback valve 322 operatively coupled to the feedback conduit 320 between the output conduit 318 and the second inlet of the pump 304. As such, a position of the feedback valve 322 affects a rate at which the heat exchange fluid flows from the output conduit 318 to the second inlet of the pump 304.

In the illustrated example of FIG. 3A, the thermal management system 300 includes a thermoelectric module (TEM) 324 (e.g., a thermoelectric cooler, a Peltier module, etc.) to transfer thermal energy to, and/or extract thermal energy from, the heat exchange fluid in the feedback conduit 320. In the illustrated example of FIG. 3A, the TEM is an annular heat exchanger that is positioned around the feedback conduit 320. As discussed in further detail below, the TEM 324 includes an annular inner annular housing in contact with the feedback conduit 320. For example, the TEM 324 can surround a circumference of a portion of the feedback conduit 320. Additionally, the TEM 324 includes junctions positioned around an outer radial surface of the annular inner housing, and an outer annular housing positioned around the junctions. The junctions include alternating N-type semiconductors and P-type semiconductors as well as metal plates to couple the respective N-type semiconductors to the respective P-type semiconductors. Accordingly, outer circumferential junctions are defined by electrical connections between a first portion of the metal plates coupling the N-type and P-type semiconductors against the outer radial housing, and inner circumferential junctions are defined by electrical connections between a second portion of the metal plates coupling the N-type and P-type semiconductors against the inner radial housing.

In the illustrated example of FIG. 3A, the thermal management system 300 includes heat exchange control circuitry 326 to control a direction in which an electrical signal travels through the TEM 324. Specifically, when the heat exchange control circuitry 326 causes transmission of the electrical signal in a first direction, the outer circumferential junctions can generate heat to warm the outer radial housing while the inner circumferential junctions absorb heat to cool the inner radial housing and, in turn, absorb thermal energy from the heat exchange fluid. Conversely, when the heat exchange control circuitry 326 causes transmission of the electrical signal in a second direction opposite the first direction, the outer circumferential junctions of the TEM 324 can absorb heat to cool the outer radial housing while the inner circumferential junctions generate heat to warm the inner radial housing and, in turn, transfer thermal energy to the heat exchange fluid. Thus, the heat exchange control circuitry 326 can cause an electrical signal to travel through the TEM 324 in the first direction to radiate thermal energy that the heat exchange fluid can absorb and/or cause the electrical signal to travel through the TEM 324 in the second direction to absorb thermal energy from the heat exchange fluid.

In the illustrated example of FIG. 3A, the heat exchange control circuitry 326 controls a direction through which the electrical signal travels through the TEM 324 based on a temperature and/or a pressure of the heat exchange fluid. Additionally, the heat exchange control circuitry 326 can control the position of the feedback valve 322 based on the temperature and/or the pressure of the heat exchange fluid. In some examples, the heat exchange control circuitry 326 controls positions of the heat source bypass valves 312 and/or the heat sink bypass valves 314 based on the temperature and/or the pressure of the heat exchange fluid and/or a temperature of the component or working fluid with which the heat exchange fluid is exchanging thermal energy.

In some examples, the thermal management system 300 includes one or more sensor(s) 328 (e.g., a pressure sensor(s), a temperature sensor(s), etc.) to measure characteristics, such as the pressure and/or the temperature, of the heat exchange fluid. In the illustrated example, the sensor(s) 328 measure the pressure and/or the temperature of the heat exchange fluid in the output conduit 318 and/or the feedback conduit 320. In some other examples, the sensor(s) 328 measure the pressure and/or the temperature of the heat exchange fluid at another location in the thermal transport bus 302.

In the illustrated example of FIG. 3A, in response to the temperature and/or the pressure of the heat exchange fluid satisfying (e.g., being less than) a temperature threshold and/or a pressure threshold, respectively, the heat exchange control circuitry 326 can cause the electrical signal to travel through the TEM 324 in the first direction to transfer heat to the heat exchange fluid. For example, during startup operations when the heat exchange fluid has been idle for an extended period and/or exposed to relatively lower ambient temperatures, the heat exchange control circuitry 326 can cause the TEM 324 to heat the heat exchange fluid to maintain the pressure within the thermal transport bus 302 within a certain range and/or maintain a state or phase of the heat exchange fluid (e.g., maintain sCO2 above a minimum temperature and a minimum pressure associated with the supercritical state). On the other hand, in response to the temperature and/or the pressure of the heat exchange fluid not satisfying (e.g., being greater than) the temperature threshold and/or the pressure threshold, the heat exchange control circuitry 326 can cause the electrical signal to travel through the TEM 324 in the second direction to extract heat from the heat exchange fluid. As a result, the TEM 324 enables the cooled heat exchange fluid to cool components in the pump 304 to help prevent the pump from overheating while also advantageously reducing vibrations encountered by the pump 304 to improve stability, reliability, and/or output of the pump 304.

In some examples, the sensor(s) 328 include an rGO sensor electrically in series with the heat exchange control circuitry 326 and the TEM 324. In such examples, an electrical conductivity of the rGO sensor is directly related to a temperature of the heat exchange fluid such that an increase in the temperature of the heat exchange fluid causes the electrical conductivity of the rGO sensor to increase. In some examples, the rGO sensor can help control an electric power of the electrical signal provided to the TEM 324 when the electrical signal travels in the second direction. Thus, the rGO sensor can cause the inner annular housing of the TEM 324 to have a temperature that is inversely proportional to the temperature of the heat exchange fluid. That is, the TEM 324 receives an increased electric power and extracts more thermal energy from the heat exchange fluid in response to the temperature of the heat exchange fluid being relatively higher. Conversely, the TEM 324 receives a reduced electric power and extracts less thermal energy from the heat exchange fluid in response to the temperature of the heat exchange fluid being relatively lower. As such, the rGO sensor can help maintain the heat exchange fluid within a certain temperature range. Additionally or alternatively, the heat exchange control circuitry 326 can control an electric power of the electrical signal provided to the TEM 324 based on the temperature and/or the pressure of the heat exchange fluid measured by the sensor(s) 328.

Figure 3B:
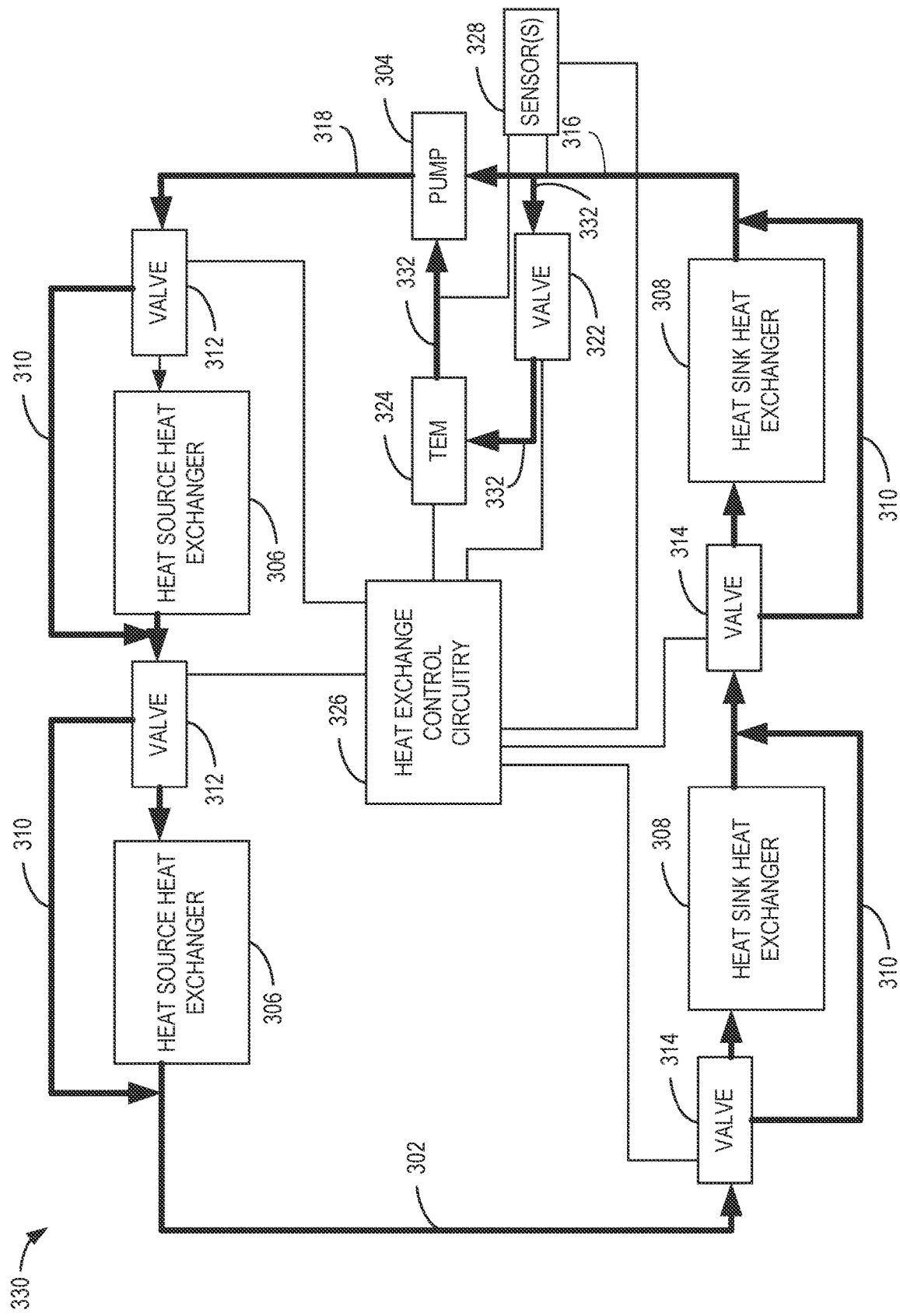
FIG. 3B is a schematic diagram of another example thermal management system for transferring heat between fluids.

FIG. 3B is a schematic view of a second example implementation of a thermal management system 330 (e.g., the thermal management system 200 of FIGS. 1 and 2) for transferring heat between the heat exchange fluid and a working fluid and/or components of the aircraft 10 and/or the gas turbine engine 100. Similar to the first thermal management system 300, the second thermal management system 330 includes the thermal transport bus 302, the pump 304, the heat source heat exchanger(s) 306, the heat sink heat exchanger(s) 308, the bypass conduits 310, the heat source bypass valves 312, the heat sink bypass valves 314, the input conduit 316, the output conduit 318, the feedback valve 322, the TEM 324, the heat exchange control circuitry 326, and the sensor(s) 328 of FIG. 3A.

In the illustrated example of FIG. 3B, the thermal management system 330 includes another example feedback conduit 332 that fluidly couples the input conduit 316 to the second inlet of the pump 304. Similar to FIG. 3A, the feedback valve 322 is operatively coupled to the feedback conduit 332, and the heat exchange control circuitry 326 can control a position of the feedback valve 322 to adjust a rate at which the heat exchange fluid flows through the feedback conduit 332. That is, the heat exchange control circuitry 326 can control the position of the feedback valve 322 based on the temperature and/or pressure of heat exchange fluid measured by the sensor(s) 328. Additionally, the heat exchange control circuitry 326 can cause the TEM 324 to transfer thermal energy to, and/or absorb thermal energy from, the heat exchange fluid in the feedback conduit 332 based on the temperature and/or the pressure of the heat exchange fluid.

Figure 3C:
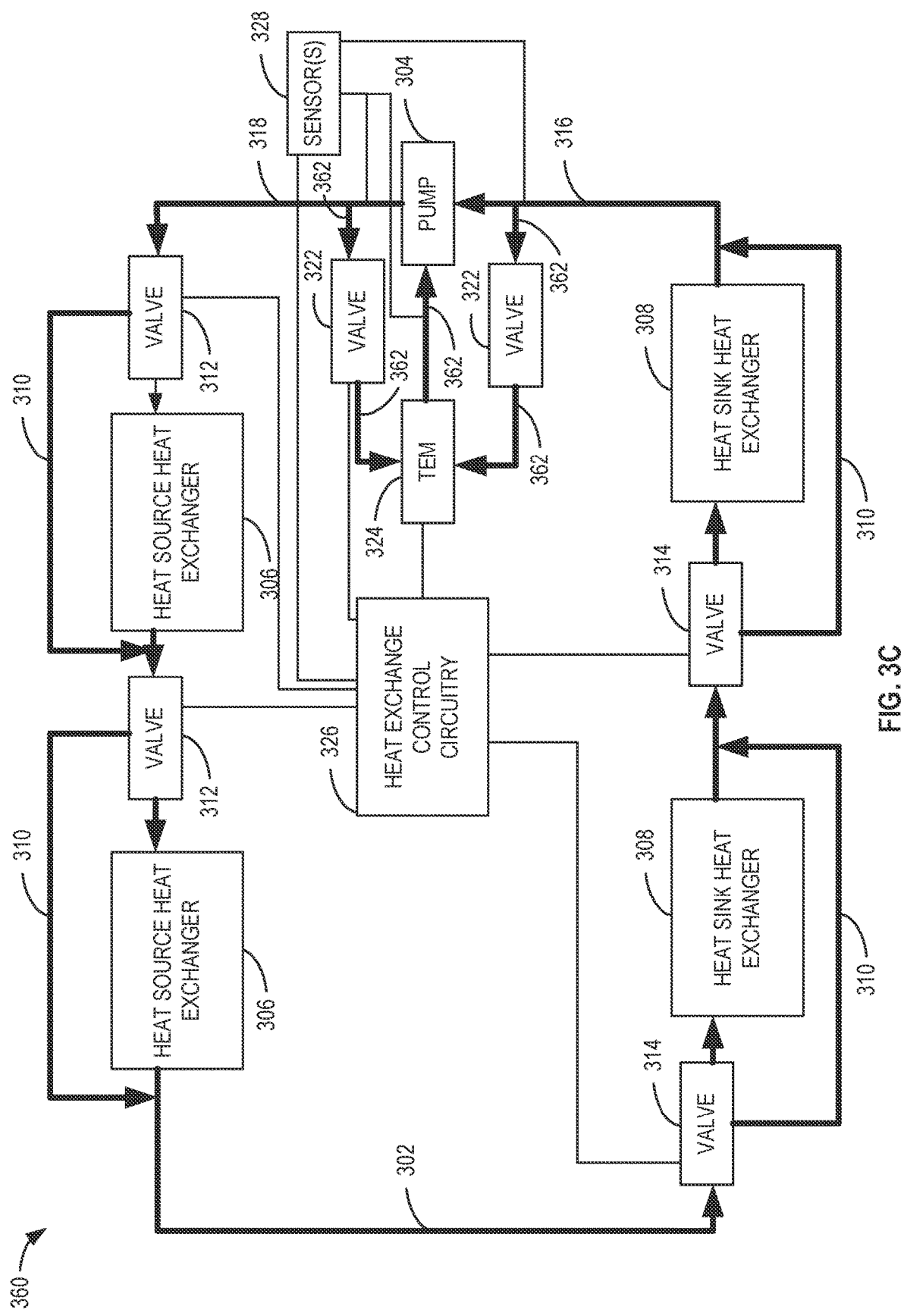
FIG. 3C is a schematic diagram of another example thermal management system for transferring heat between fluids.

FIG. 3C is a schematic view of a third example implementation of a thermal management system 360 (e.g., the thermal management system 200 of FIGS. 1 and 2) for transferring heat between the heat exchange fluid and a working fluid and/or components of the aircraft 10 and/or the gas turbine engine 100. Similar to the first thermal management system 300 and the second thermal management system 330, the third thermal management system 360 includes the thermal transport bus 302, the pump 304, the heat source heat exchanger(s) 306, the heat sink heat exchanger(s) 308, the bypass conduits 310, the bypass valves 312, 314, the input conduit 316, the output conduit 318, the TEM 324, the heat exchange control circuitry 326, and the sensor(s) 328 of FIGS. 3A and 3B.

In the illustrated example of FIG. 3C, the third thermal management system 360 includes two of the feedback valve 322 operatively coupled to another example feedback conduit(s) 362. The feedback conduit(s) 362 fluidly couples the input conduit 316 and the output conduit 318 to the second inlet of the pump 304. Further, the respective feedback valves 322 are operatively coupled to an input portion and an output portion of the feedback conduit(s) 362, respectively. Accordingly, the heat exchange control circuitry 326 can control respective positions of the feedback valves 322 to control a rate at which the heat exchange fluid flows from the input conduit 316 and/or the output conduit 318 through the feedback conduit(s) 362.

In some examples, the heat exchange control circuitry 326 causes the heat exchange fluid from the input conduit 316 or the output conduit 318 (i.e., not both) to flow through the feedback conduit(s) 362 at a certain time based on the temperature and/or pressure of the heat exchange fluid measured by the sensor(s) 328. For example, the heat exchange control circuitry 326 can cause the heat exchange fluid from the input conduit 316 to flow through the feedback conduit(s) 362 while preventing the heat exchange fluid from the output conduit 318 from flowing through the feedback conduit(s) 362 in response to the temperature of the heat exchange fluid satisfying (e.g., being less than) a temperature threshold. In such examples, the heat exchange control circuitry 326 can cause the TEM 324 to heat the heat exchange fluid in the feedback conduit(s) 362. As a result, the TEM 324 can maintain the heat exchange fluid in a certain state or phase (e.g., maintain sCO2 in a supercritical state) by preventing the temperature and/or the pressure of the heat exchange fluid from falling out of a range associated with the certain state or phase. Furthermore, the heated heat exchange fluid can flow through the second inlet of the pump 304 and mix with the heat exchange fluid that enters through the first inlet such that the warmer heat exchange fluid can increase a temperature of the heat exchange fluid that is driven through the output conduit 318.

Conversely, in some examples, the heat exchange control circuitry 326 can cause the heat exchange fluid from the output conduit 318 to flow through the feedback conduit(s) 362 while causing the heat exchange fluid from the input conduit 316 to be blocked from flowing through the feedback conduit(s) 362 in response to the temperature of the heat exchange fluid not satisfying (e.g., being greater than) the temperature threshold. In such examples, the heat exchange control circuitry 326 causes the TEM 324 to cool the heat exchange fluid in the feedback conduit(s) 362. As a result, the cooled heat exchange fluid can cool the pump 304 to minimize or otherwise reduce pump vibrations as well as increase a stability and/or a reliability of the pump 304 and prevent or otherwise reduce damage to the pump 304 from overheating. Additionally, the cooled heat exchange fluid can flow through the second inlet of the pump 304 and mix with the heat exchange fluid that enters through the first inlet such that the cooled heat exchange fluid can reduce a temperature of the heat exchange fluid that is driven through the output conduit 318.

In some examples, the heat exchange control circuitry 326 causes the heat exchange fluid from the input conduit 316 to mix with the heat exchange fluid from the output conduit 318 in the feedback conduit(s) 362. For example, the heat exchange control circuitry 326 can cause the input and output heat exchange fluid to mix in the feedback conduit 362 to help balance a pressure of the pump 304 and/or to help maintain a temperature and/or a pressure of the input and/or output heat exchange fluid in the thermal transport bus 302 within a certain range. The third thermal management system 360 is discussed further in association with FIGS. 4A-4C.

Figure 4A:
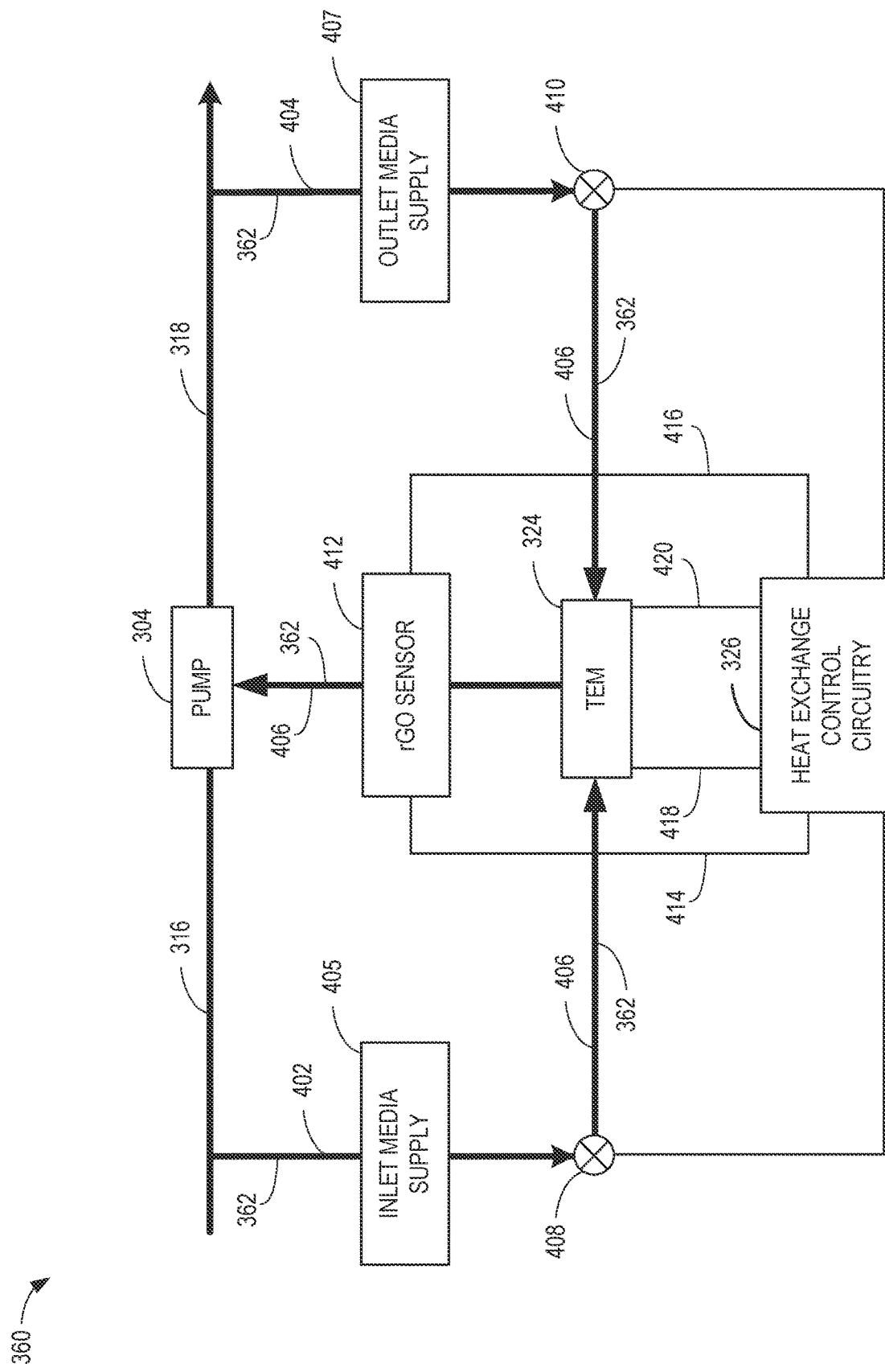
FIG. 4A is a schematic diagram of an example portion of the thermal management system of FIG. 3C.

FIG. 4A is a schematic view of a first example pump and feedback portion of the third thermal management system 360. In the illustrated example of FIG. 4A, the feedback conduit 362 includes a first section 402 in fluid connection with the input conduit 316, a second section 404 in fluid connection with the output conduit 318, and a third section 406 to fluidly couple the first section 402 and the second section 404 to the second inlet of the pump 304. Accordingly, an inlet media supply 405 (e.g., the heat exchange fluid flowing towards the first inlet of the pump 304) can flow through the first section 402 of the feedback conduit 362, and an outlet media supply 407 (e.g., the heat exchange fluid driven out of the outlet of the pump 304) can flow through the second section 404 of the feedback conduit 362.

In the illustrated example of FIG. 4A, a first feedback valve 408 (e.g., the feedback valve 322 of FIGS. 3A-3C) is positioned between the first section 402 and the third section 406 of the feedback conduit 362, and a second feedback valve 410 (e.g., the feedback valve 322) is positioned between the second section 404 and the third section 406 of the feedback conduit 362. Additionally, the TEM 324 and a rGO sensor 412 (e.g., one of the sensor(s) 328 of FIGS. 3A-3C) are operatively coupled to the third section 406 of the feedback conduit 362. Specifically, the rGO sensor 412 is positioned downstream of the TEM 324 such that the rGO sensor 412 can measure a temperature of the heat exchange fluid that results from a thermal energy exchange between the heat exchange fluid and the TEM 324. The TEM 324 is concentrically positioned around, and is in contact with, the third section 406 of the feedback conduit 362 such that the inner circumferential junctions and/or the inner annular housing of the TEM 324 can exchange thermal energy with the heat exchange fluid through the feedback conduit 362.

In the illustrated example of FIG. 4A, the heat exchange control circuitry 326 is operatively coupled to the first feedback valve 408, the second feedback valve 410, the rGO sensor 412, and the TEM 324. Accordingly, the heat exchange control circuitry 326 can modulate respective positions of the first feedback valve 408 and/or the second feedback valve 410 to throttle the heat exchange fluid that flows through the third section 406 of the feedback conduit 362. Specifically, the heat exchange control circuitry 326 modulates the respective positions of the first feedback valve 408 and/or the second feedback valve 410 based on one or more signals from pressure sensors and/or temperature sensors (e.g., the sensors 328 of FIGS. 3A-3C) that measure a pressure and/or a temperature of the heat exchange fluid.

In the illustrated example of FIG. 4A, the heat exchange control circuitry 326 utilizes the rGO sensor 412 to measure the temperature of the heat exchange fluid. The heat exchange control circuitry 326 can compare the measured temperature to a temperature threshold. Specifically, the heat exchange control circuitry 326 can transmit an electrical signal (e.g., a bias current) to the rGO sensor 412 via a first electrical coupling 414 (e.g., a first wire). Further, the rGO sensor 412 modifies the electrical signal based on the temperature of the heat exchange fluid. In particular, the electrical conductivity of the rGO sensor 412 changes based on the temperature of the heat exchange fluid, which causes the electrical signal to change with the temperature of the heat exchange fluid. Further, the heat exchange control circuitry 326 can receive the modified electrical signal from the rGO sensor 412 via a second electrical coupling 416 (e.g., a second wire). As a result, the heat exchange control circuitry 326 can determine the temperature of the heat exchange fluid based on a difference between the electrical signal transmitted via the first electrical coupling 414 and the electrical signal received via the second electrical coupling 416.

In the illustrated example of FIG. 4A, in response to the temperature of the heat exchange fluid satisfying (e.g., being less than) the temperature threshold, the heat exchange control circuitry 326 causes the first feedback valve 408 to be positioned in an open position and causes the second feedback valve 410 to be positioned in a closed position. As a result, a portion of the heat exchange fluid flowing through the input conduit 316 reroutes to the first section 402 of the feedback conduit 362 and exchanges thermal energy with the TEM 324 in advance of entering the pump 304 through the second inlet.

In the illustrated example of FIG. 4A, in response to the temperature of the heat exchange fluid satisfying the temperature threshold, the heat exchange control circuitry 326 can cause transmission of a first electrical signal that travels through the TEM 324 in a first direction. As a result, the first electrical signal causes the TEM 324 to transfer heat to the heat exchange fluid. Specifically, the heat exchange control circuitry 326 can transmit the first electrical signal to the TEM 324 via a third electrical coupling 418 (e.g., a third wire). In turn, the first electrical signal can flow from the P-type semiconductors to the N-type semiconductors at inner circumferential junctions of the TEM 324 to cause the inner circumferential junctions to radiate heat that is transferred to the heat exchange fluid through the feedback conduit 362. Thus, the TEM 324 can maintain the heat exchange fluid in a certain phase (e.g., maintain sCO2 in a supercritical state) that enables optimal thermal energy transfer between the heat exchange fluid and other working fluids and/or components of the aircraft and/or the gas turbine engine 100.

In the illustrated example of FIG. 4A, in response to the temperature of the heat exchange fluid not satisfying (e.g., being greater than) the temperature threshold, the heat exchange control circuitry 326 causes the first feedback valve 408 to move to a closed position and causes the second feedback valve 410 to move to an open position. As a result, a portion of the heat exchange fluid flowing through the output conduit 318 diverts to the second section 404 of the feedback conduit 362 and exchanges thermal energy with the TEM 324 in advance of entering the pump 304 through the second inlet.

Additionally, in response to the temperature of the heat exchange fluid not satisfying the temperature threshold, the heat exchange control circuitry 326 causes transmission of a second electrical signal that flows through the TEM 324 in a second direction opposite the first direction. As a result, the second electrical signal causes the TEM 324 to cool (e.g., absorb heat from) the heat exchange fluid. Specifically, the heat exchange control circuitry 326 can transmit the second electrical signal to the TEM 324 via a fourth electrical coupling 420 (e.g., a fourth wire). In turn, the second electrical signal can flow from the N-type semiconductors to the P-type semiconductors at inner circumferential junctions of the TEM 324 to cause the inner circumferential junctions to absorb heat and cool the inner annular housing of the TEM 324. As such, the inner annular housing of the TEM 324 can cool the feedback conduit 362 and, in turn, the heat exchange fluid. Thus, the cooled heat exchange fluid can cool components in the pump 304, reduce vibrations encountered by the pump 304, and improve a performance of the pump 304.

In some other examples, the heat exchange control circuitry 326 modulates the respective positions of the first feedback valve 408 and/or the second feedback valve 410 based on predetermined timing operations. For example, in response to activation of the thermal management system 360, the heat exchange control circuitry 326 can cause the first feedback valve 408 to be in an open position and cause the second feedback valve 410 to be in a closed position for a first predetermined period of time. In such examples, in response to an expiration of the first predetermined period of time, the heat exchange control circuitry 326 causes the first feedback valve 408 to close and/or cause the second feedback valve 410 to open. Similarly, the heat exchange control circuitry 326 can switch the direction through which the electrical signal is transmitted through the TEM 324 in response to the expiration of the first predetermined period of time. Additionally, the heat exchange control circuitry 326 can adjust an electric power of the electrical signals transmitted through the TEM 324 based on predetermined timing operations.

Figure 4B:
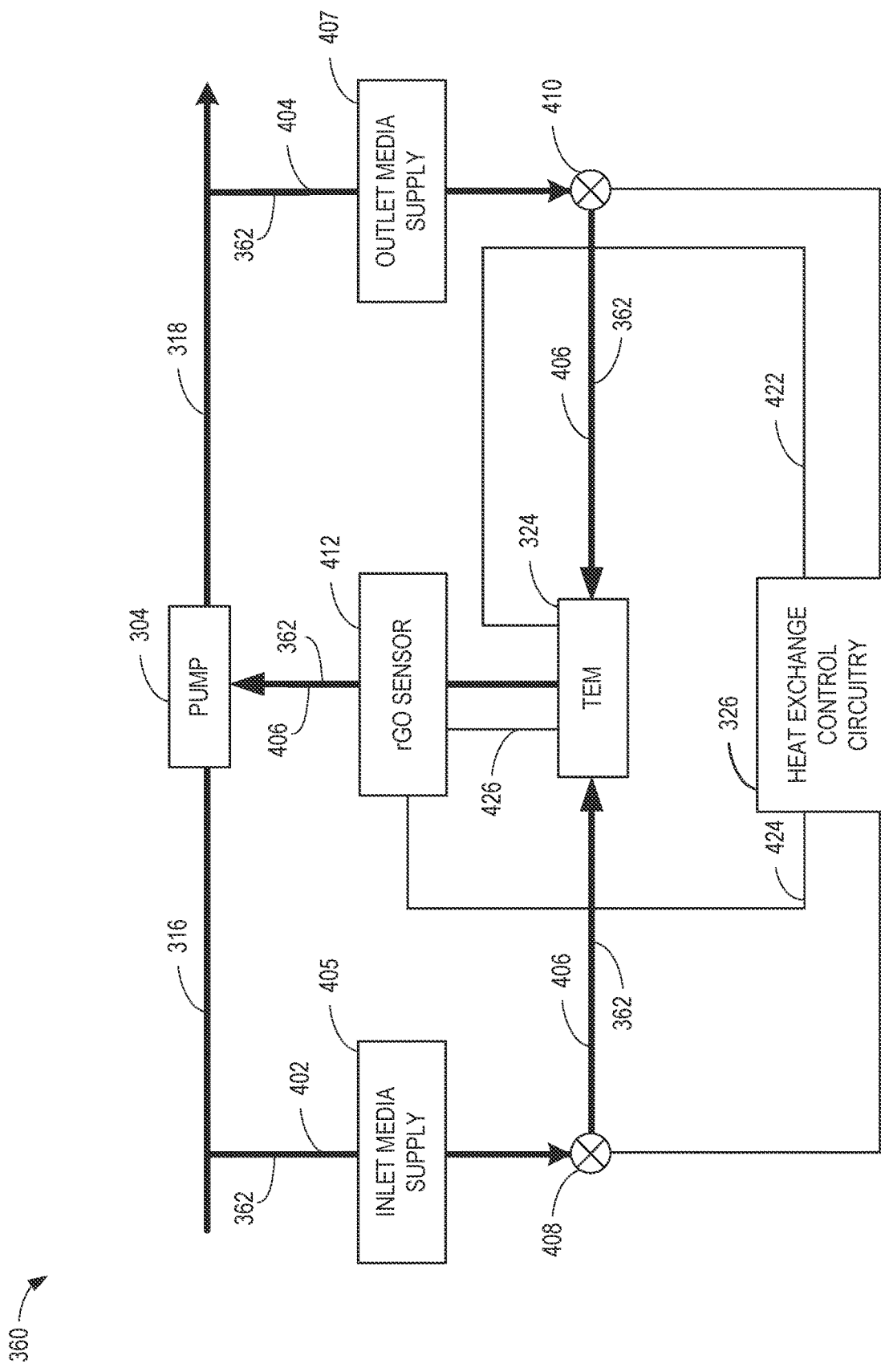
FIG. 4B is a schematic diagram of another example portion of the thermal management system of FIG. 3C.

FIG. 4B is a schematic view of a second example pump and feedback portion of the third thermal management system 360. In the illustrated example of FIG. 4B, the heat exchange control circuitry 326, the TEM 324, and the rGO sensor 412 are electrically in series and form a closed loop. In particular, the heat exchange control circuitry 326 is in connection with the TEM 324 via a first electrical coupling 422 (e.g., a first wire) and is in connection with the rGO sensor 412 via a second electrical coupling 424 (e.g., a second wire). Further, a third electrical coupling 426 (e.g., a third wire) can couple the TEM 324 to the rGO sensor 412.

In the illustrated example of FIG. 4B, the heat exchange control circuitry 326 can cause transmission of a first electrical signal to the TEM 324 via the first electrical coupling 422 in response to the temperature of the heat exchange fluid satisfying (e.g., being less than, being less than or equal to) the temperature threshold. As a result, the first electrical signal can flow from the P-type semiconductors to the N-type semiconductors at the inner circumferential junctions of the TEM 324 causing the inner annular housing of the TEM 324 to transfer heat to the heat exchange fluid in the third section 406 of the feedback conduit 362. Further, in response to the first electrical signal traveling through the TEM 324, the rGO sensor 412 receives the first electrical signal via the third electrical coupling 426. As a result, the electrical conductivity of the rGO sensor 412 causes the first electrical signal to change based on the temperature of the heat exchange fluid downstream of the TEM 324. In turn, the heat exchange control circuitry 326 receives the altered first electrical signal via the second electrical coupling 424. As a result, the heat exchange control circuitry 326 can analyze the altered electrical signal to determine the temperature of the heat exchange fluid encountered by the rGO sensor 412.

In the illustrated example of FIG. 4B, in response to determining that the temperature of the heat exchange fluid does not satisfy (e.g., is greater than) the temperature threshold, the heat exchange control circuitry 326 reverses a direction in which the electrical signal is transmitted. That is, the heat exchange control circuitry 326 causes transmission of a second electrical signal to the rGO sensor 412 via the second electrical coupling 424. As such, the rGO sensor 412 causes an electric power of the second electrical signal to change based on the temperature of the heat exchange fluid downstream of the TEM 324. Specifically, in response to encountering an increase in the temperature of the heat exchange fluid, the rGO sensor 412 causes the electric power of the second electrical signal to have an increased power when delivered to the TEM 324 via the third electrical coupling 426. As a result, the heat absorption by the TEM 324 is proportional to the temperature of the heat exchange fluid. Specifically, the altered second electrical signal reduces a temperature created at the inner circumferential junctions of the TEM 324 and, thus, increases the heat absorbed from the heat exchange fluid. For example, the inner circumferential junctions of the TEM 324 generates a first temperature in response to the rGO sensor 412 causing the altered second electrical signal to have a first electric power, and the inner circumferential junctions of the TEM 324 generates a second temperature lower than the first temperature in response to the rGO sensor 412 causing the altered second electrical signal to have a second electric power greater than the first electric power.

Thus, the TEM 324 can absorb more thermal energy from the heat exchange fluid in response to the rGO sensor 412 detecting an increased temperature. As such, the rGO sensor 412 enables the cooling provided by the TEM 324 to be adjusted based on the temperature of the heat exchange fluid while enabling the heat exchange control circuitry 326 to minimize or otherwise reduce processing of the altered second electrical signal to save computing resources. In some other examples, the heat exchange control circuitry 326 receives the altered second electrical signal via the first electrical coupling 422 and processes the altered second electrical signal to determine whether an electric power of the second electrical signal is to be adjusted.

Figure 4C:
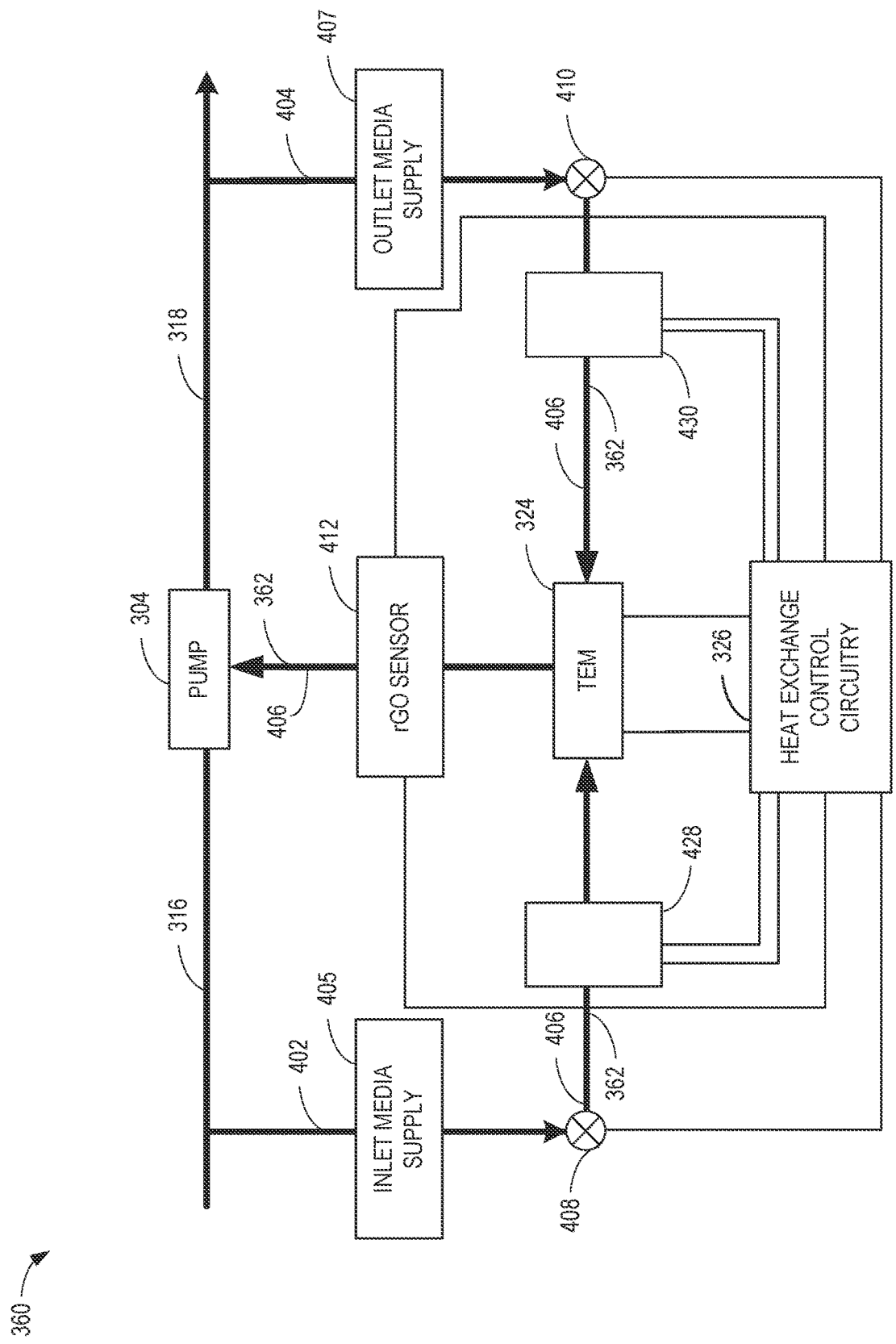
FIG. 4C is a schematic diagram of another example portion of the thermal management system of FIG. 3C.

FIG. 4C is a schematic view of a third example pump and feedback portion of the third thermal management system 360. In the illustrated example of FIG. 4C, the inlet media supply 405 can mix with the outlet media supply 407 in the third section 406 of the feedback conduit 362. In the illustrated example of FIG. 4C, a first temperature sensor 428 (e.g., a first thermistor, a first thermocouple, a first semiconductor based integrated circuit (IC) temperature sensor, etc.) is operatively coupled to the third section 406 of the feedback conduit 362 between the first feedback valve 408 and the TEM 324. Further, a second temperature sensor 430 (e.g., a second thermistor, a second thermocouple, a second semiconductor based integrated circuit (IC) temperature sensor, etc.) is operatively coupled to the third section 406 of the feedback conduit 362 between the second feedback valve 410 and the TEM 324. In some examples, the third thermal management system 360 includes pressure sensors in addition to or instead of the first temperature sensor 428 and the second temperature sensor 430.

In the illustrated example of FIG. 4C, the heat exchange control circuitry 326 is communicatively coupled to the first temperature sensor 428 and the second temperature sensor 430. As such, the heat exchange control circuitry 326 can determine a temperature of the inlet media supply 405 and the outlet media supply 407 based on signals from the first temperature sensor 428 and the second temperature sensor 430, respectively. In the illustrated example, the heat exchange control circuitry 326 modulates positions of the first feedback valve 408 and the second feedback valve 410 based on the signals from the first temperature sensor 428 and the second temperature sensor 430, respectively. Accordingly, the heat exchange control circuitry 326 helps maintain a desired temperature of the heat exchange fluid delivered to the second inlet of the pump 304 while allowing the inlet media supply 405 to mix with the outlet media supply 407 to deliver the heat exchange fluid at a higher flow rate and/or to create a higher pressure in a cavity of the pump 304 fed by the second inlet to balance against a pressure encountered at an impeller side of the pump 304.

Figure 5:
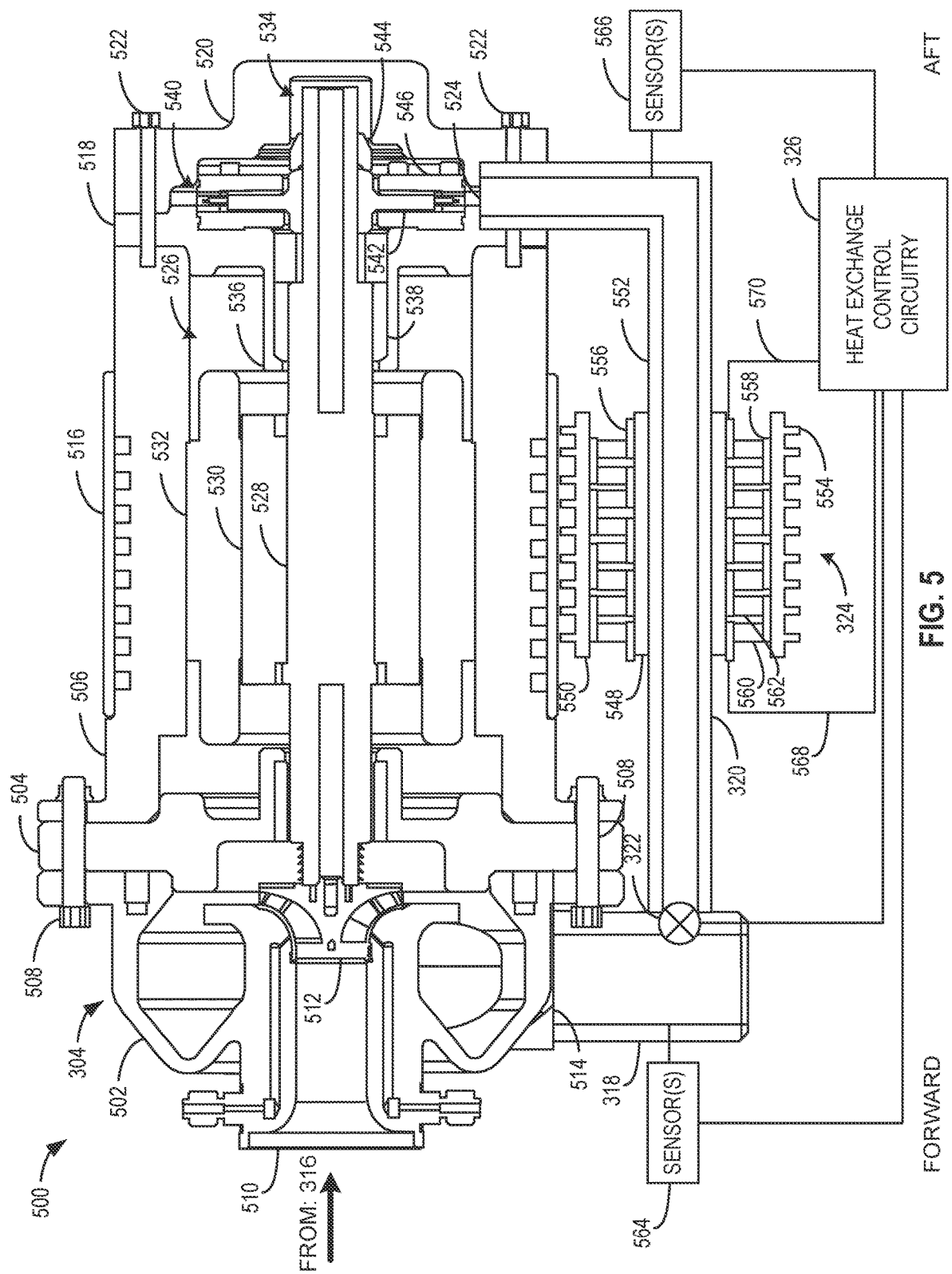
FIG. 5 illustrates an example thermal transport bus pump of the thermal management systems of FIGS. 3A-C.

FIG. 5 illustrates the TEM 324 implemented in a pump system 500 in accordance with the teachings disclosed herein. In the illustrated example of FIG. 5, the pump system 500 corresponds with a portion of the first thermal management system 300 of FIG. 3A including the pump 304, the input conduit 316, the output conduit 318, the feedback conduit 320, the feedback valve 322, the TEM 324, and the heat exchange control circuitry 326.

In the illustrated example of FIG. 5, the pump 304 includes a compressor casing 502 coupled to a backplate 504 and a motor housing 506 via bolts 508. The compressor casing 502 includes a first inlet 510 through which the pump 304 receives the heat exchange fluid from the input conduit 316. Further, the pump 304 includes an impeller 512 rotatably positioned in the compressor casing 502 to pump the heat exchange fluid through an outlet 514 and into the output conduit 318. The output conduit 318 is in fluid connection with the feedback conduit 320, and a position of the feedback valve 322 controls a rate at which the heat exchange fluid flows from the output conduit 318 into the feedback conduit 320.

In the illustrated example, the motor housing 506 is at least partially surrounded by a cooling jacket 516. An aft end of the motor housing 506 is coupled to an aft bearing housing 518 and a cover 520 via bolts 522. In some examples, the aft bearing housing 518 and/or the cover 520 are integral with the motor housing 506. Furthermore, a second inlet 524 (e.g., a secondary flow inlet) can be defined in the motor housing 506, the aft bearing housing 518, and/or the cover 520. The feedback conduit 320 is in fluid connection with a cavity 526 defined by the motor housing 506, the aft bearing housing 518 and/or the cover 520 via the second inlet 524.

In the illustrated example of FIG. 5, the pump 304 includes a shaft 528 coupled to a rotor 530 of the motor 532 in the motor housing 506. Accordingly, the rotor 530 drives a rotation of the shaft 528. In FIG. 5, an aft portion of the shaft 528 (e.g., a portion of the shaft positioned further from the inlet 510) extends through the aft bearing housing 518 and into an indentation 534 (e.g., a groove, a notch, a concavity, etc.) defined in a forward side of the cover 520. The aft bearing housing 518 includes a bearing cup 536 that extends forward into the motor housing 506.

In the illustrated example of FIG. 5, the pump 304 includes a shaft radial bearing 538 (e.g., a first radial bearing) positioned in the bearing cup 536 to radially support the aft portion of the shaft 528. For example, the shaft radial bearing 538 can be a foil bearing, a hydrodynamic bearing, and/or a rolling element bearing that includes a solid lubricant. In some examples, the shaft radial bearing 538 is coupled to the bearing cup 536 via an interference fit (e.g., a press fit), screws, or other coupling that prevents at least a portion of the shaft radial bearing 538 from rotating in the bearing cup 536. In some examples, a portion of the heat exchange fluid that flows through the second inlet 524 can pass between the shaft radial bearing 538 and the shaft 528 as the heat exchange fluid moves toward the forward end of the pump 304. In some examples, the pump 304 includes labyrinth seals positioned around the shaft 528 to help control a flow of the heat exchange fluid in the motor housing 506. For example, the labyrinth seals can help guide the heat exchange fluid that enters the pump 304 through the second inlet 524 towards the impeller 512.

In the illustrated example of FIG. 5, the pump 304 includes a thrust bearing 540 (e.g., an axial bearing) positioned aft of the shaft radial bearing 538. The thrust bearing 540 includes a thrust disc 542 clamped onto to the shaft 528 via a spanner nut 544. Further, the thrust bearing 540 includes a foil bearing 546 positioned around the thrust disc 542 to prevent or otherwise reduce axial movement of the shaft 528. In FIG. 5, the foil bearing 546 is coupled to the aft bearing housing 518 and the cover 520. For example, the foil bearing 546 can be coupled to the aft bearing housing 518 and/or the cover 520 via bolts, an interference fit, or any other means for coupling that prevents a rotation of the foil bearing 546.

In FIG. 5, the shaft 528 is coupled to the impeller 512 such that the impeller 512 rotates with the shaft 528. For example, the shaft 528 and the impeller 512 can be coupled via an interference fit. Additionally or alternatively, the impeller 512 can be coupled to the shaft 528 via a bolt, screws, or any other means for coupling that rotatably interlocks the impeller 512 and the shaft 528.

In the illustrated example of FIG. 5, the TEM 324 includes an inner annular housing 548 and an outer annular housing 550. In the illustrated example, the inner annular housing 548 is in contact with, and surrounds, an outer radial surface 552 of a portion of the feedback conduit 320. As such, the inner annular housing 548 can exchange thermal energy (e.g., cool, heat) the heat exchange fluid in the feedback conduit 320. In the illustrated example of FIG. 5, the outer annular housing 550 is in contact with air. For example, the air can be flowing through the gas turbine engine 100. In some examples, the rate at which the air flows through the gas turbine engine 100 helps prevent the TEM 324 from overheating.

In the illustrated example of FIG. 5, the inner annular housing 548 and the outer annular housing 550 include cobalt and/or cerium-palladium to help increase a thermal conductivity of the inner annular housing 548 and the outer annular housing 550 and, thus, enable the inner annular housing 548 and the outer annular housing 550 to exchange more thermal energy and/or exchange thermal energy at an increased rate. In some other examples, the inner annular housing 548 and the outer annular housing 550 include a ceramic material.

In the illustrated example of FIG. 5, the outer radial housing includes outer fins 554 (e.g., protrusions, ridges, juts, etc.) that extend radially outward from the outer annular housing 550 to increase a surface area across which the outer annular housing 550 can exchange thermal energy with the surrounding air. In some examples, the inner annular housing 548 includes inner fins (e.g., protrusions, ridges, juts, etc.) that extend centripetally from the inner annular housing 548 to increase a surface area along which the inner annular housing 548 contacts the feedback conduit 320, as discussed further in association with FIG. 6B.

In the illustrated example of FIG. 5, the TEM 324 includes inner circumferential metal plates 556 positioned against an outer radial surface of the inner annular housing 548. Similarly, the TEM 324 includes outer circumferential metal plates 558 positioned against an inner radial surface of the outer annular housing 550. Further, the TEM 324 includes P-type semiconductors 560 and N-type semiconductors 562 electrically coupled to the metal plates 556, 558. Specifically, inner radial ends of the semiconductors 560, 562 are coupled to the inner circumferential metal plates 556, and outer radial ends of the semiconductors 560, 562 are coupled to the outer circumferential metal plates 558. Accordingly, the semiconductors 560, 562 are positioned around the inner annular housing 548. Further, the P-type semiconductors 560 and the N-type semiconductors 562 are alternating such that one P-type semiconductor 560 and one N-type semiconductor 562 are coupled to the respective metal plates 556, 558.

In some examples, the TEM 324 is formed via additive manufacturing. For example, the TEM 324 can be additively printed onto the feedback conduit 320. In some examples, the TEM 324 is formed as separate pieces (e.g., two halves) that are positioned around the feedback conduit 320 and coupled.

During operation, as the shaft 528 rotates the impeller 512, the impeller 512 compresses and drives the heat exchange fluid radially outward. In turn, the heat exchange fluid can be driven through the outlet 514 of the pump 304 and into the output conduit 318. In the illustrated example of FIG. 5, a first sensor(s) 564 (e.g., a temperature pressure and/or a pressure sensor, the sensor(s) 328 of FIG. 3A) measures a first temperature and/or a first pressure of the heat exchange fluid in the output conduit 318. Further, the heat exchange control circuitry 326 controls a position of the feedback valve 322 based on the measured first temperature and/or pressure. For example, in response to the first temperature of the heat exchange fluid satisfying (e.g., being greater than or equal to) a first temperature threshold, the heat exchange control circuitry 326 can adjust the feedback valve 322 to a first position that causes the heat exchange fluid to flow through the feedback conduit 320 with a first volumetric flow rate. Further, in response to the temperature of the heat exchange fluid satisfying (e.g., being greater than or equal to) a second temperature threshold greater than the first temperature threshold, the heat exchange control circuitry 326 can adjust the feedback valve 322 to a second position that causes the heat exchange fluid to flow through the feedback conduit 320 with a second volumetric flow rate greater than the first volumetric flow rate.

During operation, the TEM 324 can heat or cool the heat exchange fluid in the feedback conduit 320 based on the temperature and/or the pressure of the heat exchange fluid. In some examples, a second sensor(s) 566 measures a second temperature and/or a second pressure of the heat exchange fluid in the feedback conduit 320 between the TEM 324 and the second inlet 524. In such examples, the heat exchange control circuitry 326 causes the TEM 324 to transfer heat to the heat exchange fluid in response to the second temperature and/or the second pressure satisfying (e.g., being less than, being less than or equal to) a third temperature threshold and/or a pressure threshold. Specifically, the heat exchange control circuitry 326 can cause transmission of an electrical signal to the TEM 324 via a first electrical coupling 568, which causes the electrical signal to travel through the TEM 324 in a first direction. When traveling through the TEM 324 in the first direction, the electrical signal travels from the P-type semiconductors 560 to the N-type semiconductors 562 at the inner circumferential metal plates 556 and travels from the N-type semiconductors 562 to the P-type semiconductors 560 at the outer circumferential metal plates 558. As a result, the inner circumferential metal plates 556 radiate heat that is absorbed by the inner annular housing 548 and transferred to heat exchange fluid through the feedback conduit 320. Further, the outer circumferential metal plates 558 absorb heat from the surrounding air via the outer annular housing 550.

In the illustrated example of FIG. 5, in response to the second temperature and/or the second pressure not satisfying (e.g., being greater than, being greater than or equal to) the third temperature threshold and/or the pressure threshold, respectively, the heat exchange control circuitry 326 causes the TEM 324 to absorb heat from the heat exchange fluid in the feedback conduit 320. Specifically, the heat exchange control circuitry 326 can cause transmission of an electrical signal to the TEM 324 via a second electrical coupling 570, which causes the electrical signal to travel through the TEM 324 in a second direction (e.g., in an opposite direction of the first direction). When traveling through the TEM 324 in the second direction, the electrical signal passes from the N-type semiconductors 562 to the P-type semiconductors 560 at the inner circumferential metal plates 556 and passes from the P-type semiconductors 560 to the N-type semiconductors 562 at the outer circumferential metal plates 558. As a result, the inner circumferential metal plates 556 are cooled and absorb heat from the heat exchange fluid through the feedback conduit 320. Further, the outer circumferential metal plates 558 radiate heat, which is absorbed by the outer annular housing 550 and transferred to the air flowing by the TEM 324.

In some examples, the heat exchange control circuitry 326 determines an electric power of the electrical signal based on the second temperature and/or the second pressure. For example, in response to the second temperature satisfying (e.g., being greater than, being greater than or equal to) a fourth temperature threshold, the heat exchange control circuitry 326 can cause the electrical signal being transmitted in the second direction to have a first electric power. Further, in response to the second temperature satisfying (e.g., being greater than, being greater than or equal to) a fifth temperature threshold (e.g., a temperature threshold defined by an increased temperature compared to the fourth temperature threshold), the heat exchange control circuitry 326 can cause the electrical signal being transmitted in the second direction to have a second electric power greater than the first electric power. As a result, the semiconductors 560, 562 can cause the inner circumferential metal plates 556 to absorb more heat further cooling the inner annular housing 548 and, in turn, causing the heat exchange fluid to encounter a greater reduction in thermal energy. Thus, the TEM 324 can maintain the heat exchange fluid within a desired temperature range and/or pressure range based on encountered fluid characteristics and/or operations.

Figure 6B:
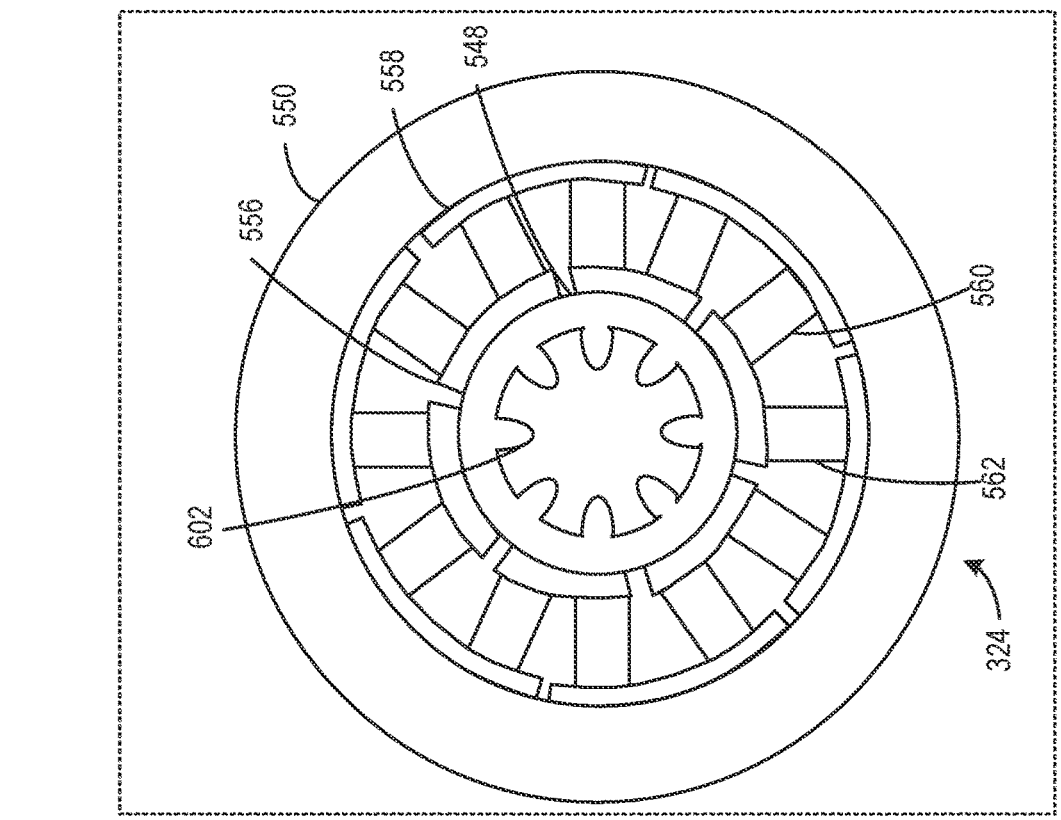
FIG. 6B illustrates a cross-sectional view of the example heat exchanger of FIGS. 3A-3C, 4A-4C, 5 and/or 6A.
Figure 6A:
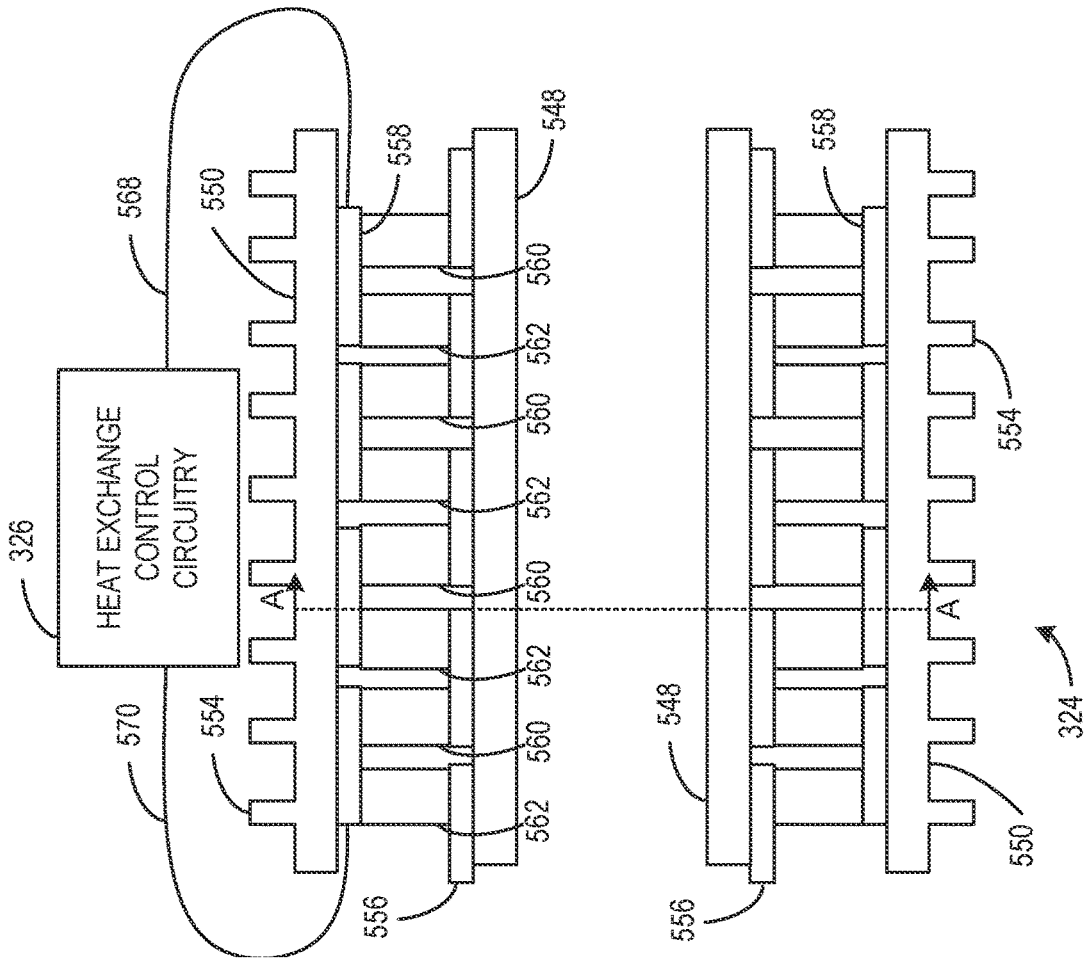
FIG. 6A illustrates an example annular heat exchanger of FIGS. 3A-3C, 4A-4C, and/or 5.

FIG. 6A illustrates a magnified view of the TEM 324 including the inner annular housing 548, the outer annular housing 550, the outer fins 554, the inner circumferential metal plates 556, the outer circumferential metal plates 558, the P-type semiconductors 560, and the N-type semiconductors 562. In the illustrated example of FIG. 6A, the first electrical coupling 568 and the second electrical coupling 570 are coupled to the outer circumferential metal plates 558. In some other examples, the first electrical coupling 568 and/or the second electrical coupling 570 is/are coupled to the inner circumferential metal plate(s) 556.

FIG. 6B illustrates an example cross-section A-A of the TEM 324. In the illustrated example of FIG. 6B, the TEM 324 includes inner fins 602 extending centripetally from the inner annular housing 548. Specifically, the inner fins 602 extend past an outer diameter defined by at least a portion of the feedback conduit 320. For example, the outer radial surface 552 of the feedback conduit 320 can include divots (e.g., cavities, nooks, indents, etc.) into which the inner fins 602 can extend. As such, the inner fins 602 enable the TEM 324 to exchange thermal energy with the heat exchange fluid across an increased surface area of the feedback conduit 320, which enables the TEM 324 to increase and/or decrease the temperature and/or the pressure of the heat exchange fluid at an increased rate.

Figure 7:
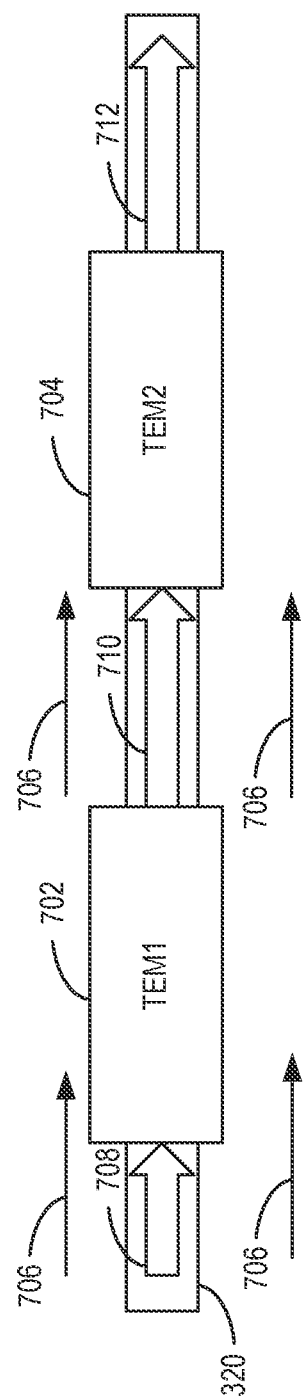
FIG. 7 is a schematic diagram of a plurality of annular heat exchangers being implemented in the thermal management systems of FIGS. 3A-3C.

FIG. 7 is a schematic view of a first TEM 702 (e.g., the TEM 324) positioned around a first portion of the feedback conduit 320 and a second TEM 704 (e.g., the TEM 324) positioned around a second portion of the feedback conduit 320 downstream of the first portion. In some examples, utilization of the first TEM 702 and the second TEM 704 reduces an electric power consumption associated with thermal management compared to utilization of a single, larger TEM. Thus, the first TEM 702 and the second TEM 704 can provide a faster temperature increase or decrease as the heat exchange fluid flows through the feedback conduit 320 while requiring a reduced power input. In some examples, more than two of the TEM 324 can be utilized to heat and/or cool the heat exchange fluid.

During operation, under cowl air 706 flows around the first TEM 702 and the second TEM 704 to provide a medium that can supply heat to, and/or absorb heat from, the outer annular housings (e.g., the outer annular housing 550 of FIGS. 5 and 6A-6B) of the first TEM 702 and the second TEM 704. In the illustrated example of FIG. 7, during cooling operations, a first heat exchange fluid portion 708 flowing towards the first TEM 702 has a first temperature. Further, the first TEM 702 causes a second heat exchange fluid portion 710 flowing between the first TEM 702 and the second TEM 704 to have a second temperature less than the first temperature. The second TEM 704 causes a third heat exchange fluid portion 712 flowing away from the second TEM 704 to have a third temperature less than the second temperature. Thus, the feedback conduit 320 can deliver the heat exchange fluid to the pump 304 at the third temperature to help reduce vibrations and increase a stability and reliability of the pump 304 while also reducing the temperature of the heat exchange fluid driven into the output conduit 318 of FIGS. 3A-3C, 4A-4C, and 5.

In the illustrated example of FIG. 7, during heating operations, the first heat exchange fluid portion 708 has the first temperature. In turn, the first TEM 702 causes the second heat exchange fluid portion to have a fourth temperature greater than the first temperature. Further, the second TEM 704 causes the third heat exchange fluid portion 712 to have a fifth temperature greater than the fourth temperature. Thus, the feedback conduit 320 can deliver the heat exchange fluid to the pump 304 at the fifth temperature to help maintain the heat exchange fluid in a certain state (e.g., a supercritical state) as well as increase the temperature of the heat exchange fluid driven into the output conduit 318.

In some examples, the first TEM 702 and the second TEM 704 are positioned around separate conduits that are arranged in parallel and respectively deliver separate portions (e.g., a first portion and a second portion, respectively) of the heat exchange fluid to the pump 304. In such examples, the first TEM 702 and the second TEM 704 transfer thermal energy to and/or absorb thermal energy from the separate portions of the heat exchange fluid in parallel. Further, the amount of thermal energy that the first TEM 702 and the second TEM 704 transfer to and/or absorb from the separate portions of the heat exchange fluid can be based on the respective temperatures and/or pressures of the heat exchange fluid in the respective conduits.

Figure 8:
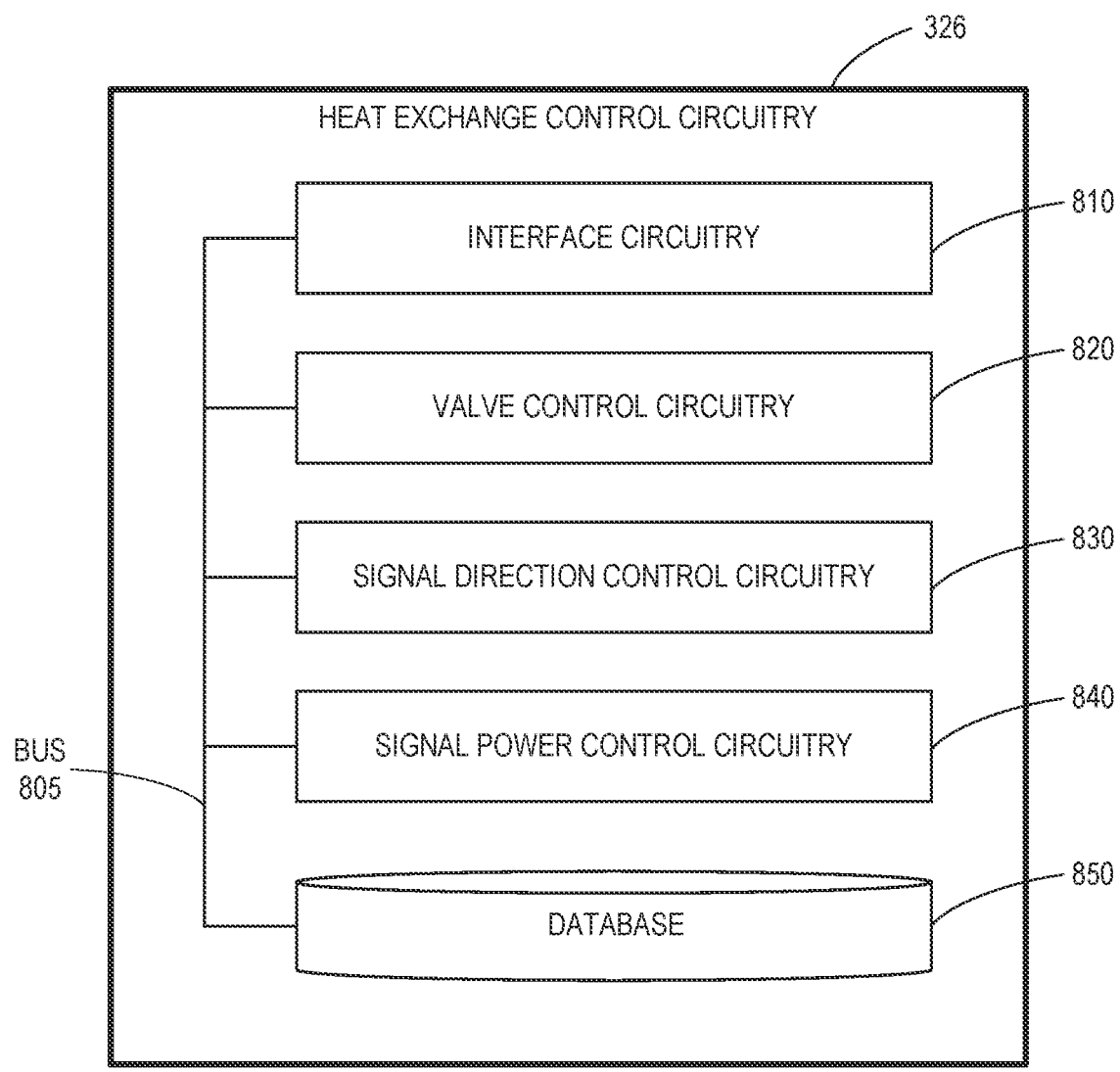
FIG. 8 is a block diagram of example heat exchange control circuitry of FIGS. 3A-3C, 4A-4C, 5, and/or 6A.

FIG. 8 is a block diagram of the heat exchange control circuitry 326 to control a thermal energy of the heat exchange fluid in the thermal management systems 300, 330, 360. The heat exchange control circuitry 326 of FIG. 8 may be instantiated (e.g., creating an instance of, bring into being for any length of time, materialize, implement, etc.) by processor circuitry such as a central processing unit executing instructions. Additionally or alternatively, the heat exchange control circuitry 326 of FIG. 8 may be instantiated (e.g., creating an instance of, bring into being for any length of time, materialize, implement, etc.) by an ASIC or an FPGA structured to perform operations corresponding to the instructions. It should be understood that some or all of the circuitry of FIG. 8 may, thus, be instantiated at the same or different times. Some or all of the circuitry may be instantiated, for example, in one or more threads executing concurrently on hardware and/or in series on hardware. Moreover, in some examples, some or all of the circuitry of FIG. 8 may be implemented by microprocessor circuitry executing instructions to implement one or more virtual machines and/or containers.

In the illustrated example of FIG. 8, the heat exchange control circuitry 326 includes a bus 805, interface circuitry 810, valve control circuitry 820, signal direction control circuitry 830, signal power control circuitry 840, and a database 850. In the illustrated example of FIG. 8, the interface circuitry 810, the valve control circuitry 820, the signal direction control circuitry 830, the signal power control circuitry 840, and the database 850 are in communication with the bus 805. In some examples, the bus 805 can be implemented with bus circuitry, bus software, and/or bus firmware. For example, the bus 805 can be implemented by at least one of an Inter-Integrated Circuit (I2C) bus, a Serial Peripheral Interface (SPI) bus, a Peripheral Component Interconnect (PCI) bus, or a Peripheral Component Interconnect Express (PCIe or PCIE) bus. Additionally or alternatively, the bus 805 can be implemented by any other type of computing or electrical bus.

The heat exchange control circuitry 326 of FIG. 8 includes the interface circuitry 810 to receive and/or transmit signals. In some examples, the interface circuitry 810 receives signals indicative of pressure data and/or temperature data from the TEM 324 of FIG. 4B, the sensor(s) 328 of FIGS. 3A-3C, the rGO sensor 412 of FIGS. 4A-4C, the temperature sensors 428, 430 of FIG. 4C, the first sensor(s) 564 of FIG. 5, and/or the second sensors 566 of FIG. 5. In some examples, the interface circuitry 810 transmits signals to the sensor(s) 328, the rGO sensor 412, the temperature sensors 428, 430, the first sensor(s) 564, and/or the second sensors 566 to enable the sensors 328, 412, 428, 430, 564, 566 to form the signals indicative the pressure data and/or the temperature data. In some examples, the interface circuitry 810 transmits signals to the TEM 324 of FIGS. 3A-3C, 4A-4C, 5, and 6A-6B, the first TEM 702 of FIG. 7, and/or the second TEM 704 of FIG. 7 to cause the TEM 324, 702, 704 to transfer thermal energy to and/or extract thermal energy from the heat exchange fluid. In some examples, the interface circuitry 810 receives signals indicative of the temperature data from the TEM 324, 702, 704. In some examples, the interface circuitry 810 transmits signals to the heat source valves 312 of FIGS. 3A-3C, the heat sink valves 314 of FIGS. 3A-3C, the feedback valve(s) 322 of FIGS. 3A-3C, and 5, the first feedback valve 408 of FIGS. 4A-4C, and/or the second feedback valve 410 of FIGS. 4A-4C to cause positional adjustments. In some examples, the interface circuitry 810 is instantiated by processor circuitry executing interface instructions and/or configured to perform operations such as those represented by the flowcharts of FIGS. 9-12.

The heat exchange control circuitry 326 of FIG. 8 includes the valve control circuitry 820 to determine positions in which thermal management valves are to be configured. For example, the valve control circuitry 820 can determine positions in which the heat source valves 312, the heat sink valves 314, the feedback valve(s) 322, the first feedback valve 408, and/or the second feedback valve 410 are to be configured. In some examples, the valve control circuitry 820 determines the positions in which the valves are to be configured based on the pressure data and/or the temperature data associated with the heat exchange fluid. For example, the valve control circuitry 820 can cause the valves 312, 314, 322, 408, 410 to at least partially open or close in response to the temperature of the heat exchange fluid satisfying a temperature threshold and/or a pressure of the heat exchange fluid satisfying a pressure threshold. In some examples, the valve control circuitry 820 is instantiated by processor circuitry executing valve control instructions and/or configured to perform operations such as those represented by the flowcharts of FIGS. 9-12.

The heat exchange control circuitry 326 of FIG. 8 includes the signal direction control circuitry 830 to control a direction in which a signal travels through a TEM and, thus, control whether the TEM absorbs heat from, or transfers heat to, the heat exchange fluid. For example, the signal direction control circuitry 830 can cause a signal to travel through the TEM 324, 702, 704 in a first direction to cause the TEM 324, 702, 704, to radiate heat that is absorbed by the heat exchange fluid in response to the temperature of the heat exchange fluid satisfying (e.g., being less than, being less than or equal to) a temperature threshold and/or the pressure of the heat exchange fluid satisfying (e.g., being less than, being less than or equal to) a pressure threshold. Alternatively, the signal direction control circuitry 830 can cause a signal to travel through the TEM 324, 702, 704 in a second direction (e.g., a direction opposite the first direction) to cause the TEM 324, 702, 704 to absorb heat from the heat exchange fluid in response to the temperature of the heat exchange fluid not satisfying (e.g., being greater than, being greater than or equal to) the temperature threshold and/or the pressure of the heat exchange fluid not satisfying (e.g., being greater than, being greater than or equal to) the pressure threshold. In some examples, the signal direction control circuitry 830 is instantiated by processor circuitry executing signal direction control instructions and/or configured to perform operations such as those represented by the flowcharts of FIGS. 9-12

The heat exchange control circuitry 326 of FIG. 8 includes the signal power control circuitry 840 to determine a signal power (e.g., a current and/or a voltage) for the signal to be transmitted to the TEM to control the amount of thermal energy that the TEM transfers to, or absorbs from, the heat exchange fluid. In some examples, the signal power control circuitry 840 determines the electric power based on the temperature and/or the pressure of the heat exchange fluid. For example, the signal power control circuitry 840 can determine the signal is to have a first electric power (e.g., a first current, a first voltage) in response to the temperature of the heat exchange fluid satisfying (e.g., being greater than) a first temperature threshold and/or the pressure of the heat exchange fluid satisfying (e.g., being greater than) a first pressure threshold. Further, the signal power control circuitry 840 can determine the signal is to have a second electric power (e.g., a second current, a second voltage) in response to the temperature of the heat exchange fluid satisfying (e.g., being greater than) a second temperature threshold and/or the pressure of the heat exchange fluid satisfying (e.g., being greater than) a second pressure threshold. In some examples, the signal power control circuitry 840 is instantiated by processor circuitry executing signal power control instructions and/or configured to perform operations such as those represented by the flowcharts of FIGS. 9-12.

The heat exchange control circuitry 326 of FIG. 8 includes the database 850 to store thresholds utilized to determine thermal management operations. In some examples, the database 850 includes temperature and/or pressure thresholds associated with valve positions. In some examples, the database 850 includes temperature and/or pressure thresholds associated with switching a direction in which a signal is transmitted to the TEM 324, 702, 704. In some examples, the database 850 includes temperature and/or pressure thresholds associated with currents and/or voltages to be transmitted to the TEM 324, 702, 704.

In some examples, the thermal management system 300, 330, 360 of FIGS. 3A-3C include means for pumping a first fluid. For example, the means for pumping may be implemented by the pump 304 of FIGS. 3A-C, 4A-C, and/or 5.

In some examples, the thermal management system 300, 330, 360 includes means for transporting the first fluid. In such examples, the means for transporting the first fluid is fluidly coupled to the means for pumping. For example, the means for transporting the first fluid may be implemented by the thermal transport bus 302. In some example, the means for transporting the fluid is implemented by the input conduit 316 of FIGS. 3A-C, 4A-C, and/or 5 and/or the output conduit 318 of FIGS. 3A-C, 4A-C, and/or 5.

In some examples, the thermal management system 300, 330, 360 includes means for returning the first fluid to the means for pumping. In such examples, the means for returning is fluidly coupled to the means for transporting. For example, the means for returning may be implemented by the feedback conduit(s) 320, 332, 362 of FIGS. 3A-C, 4A-C, 5, and/or 7.

In some examples, the thermal management system 300, 330, 360 includes means for adjusting a thermal energy of the first fluid. In some examples, the means for adjusting the first thermal energy of the first fluid including a means for increasing the first thermal energy of the first fluid or a second thermal energy of a second fluid on a first side of the means for adjusting. In some examples, the means for adjusting the first thermal energy of the first fluid including a means for decreasing the first thermal energy of the first fluid or the second thermal energy of the second fluid on a second side of the means for adjusting. In such examples, the first side can be an inner radial surface that defines an inner circumference of the means for adjusting, and the second side can be an outer radial surface that defines an outer circumference of the means for adjusting. For example, the means for adjusting may be implemented by the TEM 324, 702, 704. Furthermore, the means for increasing and the means for decreasing may be implemented by the inner annular housing 548, the outer annular housing 550, the inner circumferential metal plates 556, the P-type semiconductors 560, and/or the N-type semiconductors 562.

In some examples, the thermal management system 300, 330, 360 includes means for controlling the means for adjusting. In some examples, the means for controlling is to cause the means for increasing to be in thermal contact with the means for returning in response at least one of a pressure of the first fluid not satisfying (e.g., being less than, being less than or equal to) a pressure threshold or a temperature of the first fluid not satisfying (e.g., being less than, being less than or equal to) a temperature threshold. In some examples, the means for controlling is to cause the means for decreasing to be in thermal contact with the means for returning in response to at least one of the pressure of the first fluid satisfying (e.g., being greater than, being greater than or equal to) the pressure threshold or the temperature of the first fluid satisfying (e.g., being greater than, being greater than or equal to) the temperature threshold. For example, the means for controlling may be implemented by heat exchange control circuitry 326. In some examples, the heat exchange control circuitry 326 may be instantiated by processor circuitry such as the example processor circuitry 1312 of FIG. 13. For instance, the heat exchange control circuitry 326 may be instantiated by a microprocessor executing machine executable instructions such as those implemented by at least blocks 902, 904, 906, 908, 910, 912, 914 of FIG. 9, 1002, 1004, 1006, 1008, 1010, 1012, 1014, 1016 of FIG. 10, 1102, 1104, 1106, 1108 of FIG. 11, and/or 1202, 1204, 1206, 1208. In some examples, the heat exchange control circuitry 326 may be instantiated by hardware logic circuitry, which may be implemented by an ASIC, XPU, or FPGA circuitry structured to perform operations corresponding to the machine readable instructions. Additionally or alternatively, the heat exchange control circuitry 326 may be instantiated by any other combination of hardware, software, and/or firmware. For example, the heat exchange control circuitry 326 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

While an example manner of implementing the heat exchange control circuitry 326 of FIGS. 3A-C, 4A-C, 5, and/or 6A is illustrated in FIG. 8, one or more of the elements, processes, and/or devices illustrated in FIG. 8 may be combined, divided, re-arranged, omitted, eliminated, and/or implemented in any other way. Further, the example interface circuitry 810, the example valve control circuitry 820, the example signal direction control circuitry 830, the example signal power control circuitry 840, the example database 850 and/or, more generally, the example heat exchange control circuitry 326 of FIGS. 3A-3C, 4A-4C, 5, and/or 6A, may be implemented by hardware alone or by hardware in combination with software and/or firmware. Thus, for example, any of the example interface circuitry 810, the example valve control circuitry 820, the example signal direction control circuitry 830, the example signal power control circuitry 840, the example database 850 and/or, more generally, the example heat exchange control circuitry 326 of FIGS. 3A-3C, 4A-4C, 5, and/or 6A, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example heat exchange control circuitry 326 of FIGS. 3A-3C, 4A-4C, 5, and/or 6A may include one or more elements, processes, and/or devices in addition to, or instead of, those illustrated in FIG. 8, and/or may include more than one of any or all of the illustrated elements, processes and devices.

Flowcharts representative of example machine readable instructions, which may be executed to configure processor circuitry to implement the heat exchange control circuitry 326 of FIGS. 3A-3C, 4A-4C, 5, 6A, and 8, are shown in FIGS. 9-12. The machine readable instructions may be one or more executable programs or portion(s) of an executable program for execution by processor circuitry, such as the processor circuitry 1312 shown in the example processor platform 1300 discussed below in connection with FIG. 13. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across a plurality of hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowcharts illustrated in FIGS. 9-12, many other methods of implementing the example heat exchange control circuitry 326 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU, an XPU, etc.) in a single machine, a plurality of processors distributed across a plurality of servers of a server rack, a plurality of processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in a plurality of parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example operations of FIGS. 9-12 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory computer readable storage medium, non-transitory machine readable medium, and non-transitory machine readable storage medium are expressly defined to include any type of computer readable storage device and/or storage disk and to exclude propagating signals and to exclude transmission media. As used herein, the terms "computer readable storage device" and "machine readable storage device" are defined to include any physical (mechanical and/or electrical) structure to store information, but to exclude propagating signals and to exclude transmission media. Examples of computer readable storage devices and machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer readable instructions, machine readable instructions, etc.

Figure 9:
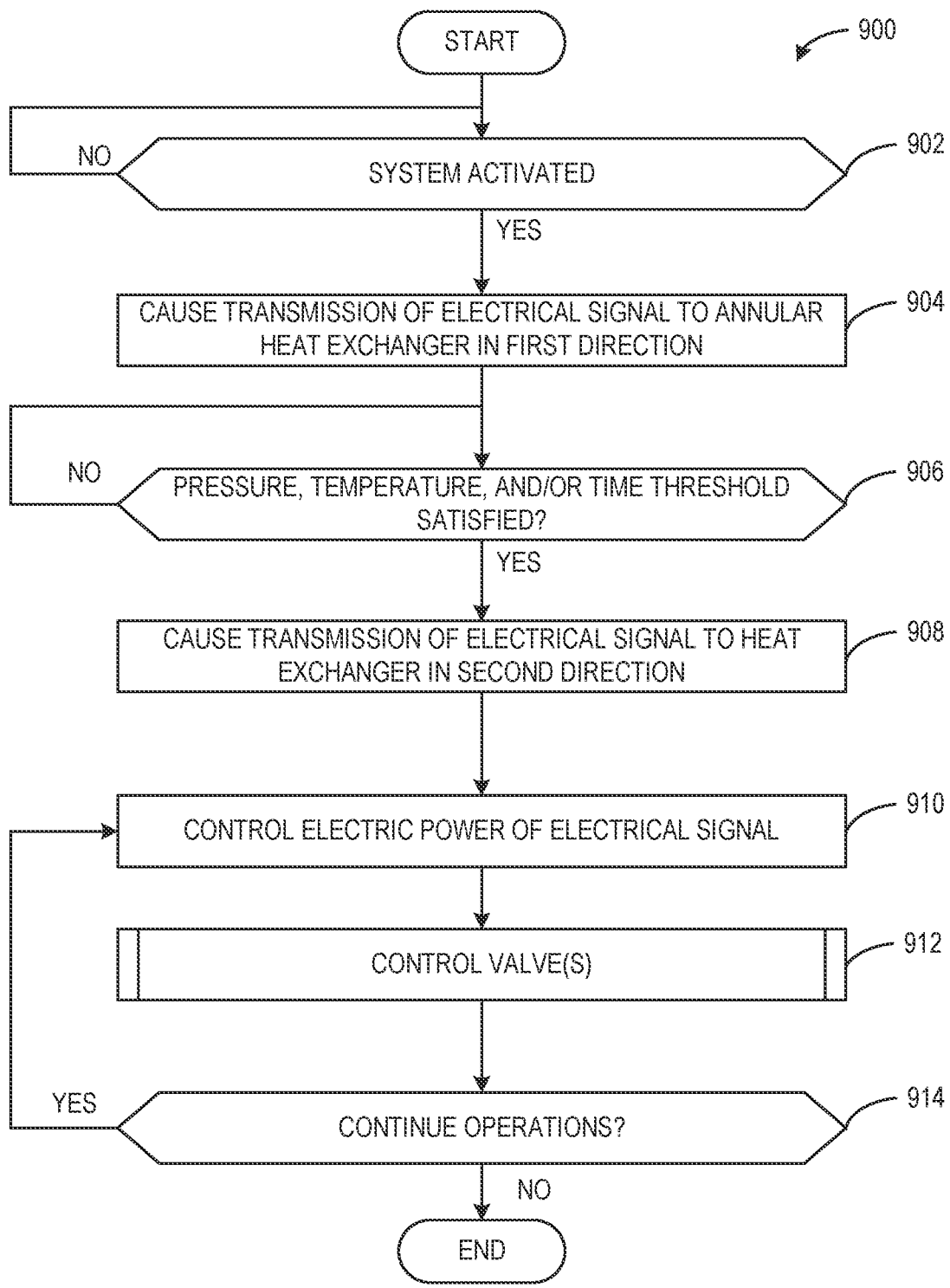
FIG. 9 is a flowchart representative of example machine readable instructions and/or example operations that may be executed by example processor circuitry to implement the heat exchange control circuitry of FIG. 8.

FIG. 9 is a flowchart representative of example machine readable instructions and/or example operations 900 that may be executed and/or instantiated by processor circuitry to control thermal energy of a fluid in a thermal management system. The machine readable instructions and/or the operations 900 of FIG. 9 begin at block 902, at which the heat exchange control circuitry 326 (FIGS. 3A-3C, 4A-4C, 5, 6A-6B, and/or 8) determines whether a thermal management system (e.g., the thermal management system 300 of FIG. 3A, the thermal management system 330 of FIG. 3B, the thermal management system 360 of FIGS. 3C and 4A-4C) is active. In response to the thermal management system being activated, the operations proceed to block 904.

At block 904, the heat exchange control circuitry 326 causes transmission of an electrical signal to an annular heat exchanger (e.g., the TEM 324 of FIGS. 3A-3C, 4A-4C, 5, 6A, and/or 6B, the first TEM 702 of FIG. 7, the second TEM 704 of FIG. 7) in a first direction. For example, the signal direction control circuitry 830 (FIG. 8) causes the interface circuitry 810 (FIG. 8) to transmit the electrical signal in the first direction. As a result, the annular heat exchanger transfers thermal energy to the fluid. In some examples, the signal direction control circuitry 830 determines the electrical signal is to be transmitted in the first direction in response to a temperature of a fluid not satisfying (e.g., being less than, being less than or equal to) a first temperature threshold (e.g., 305 Kelvin (K), 315 K, 325 K, etc.) or a pressure of the fluid not satisfying (e.g., being less than, being less than or equal to) a first pressure threshold (e.g., 1,070 pounds per square inch (psi), 1,090 psi, 1,120 psi, etc.). In this example, the first temperature threshold and the first pressure threshold are associated with the maintenance of the fluid in a certain phase, such as the maintenance of carbon dioxide in a supercritical phase. In some examples, the sensor(s) 328 of FIGS. 3A-3C, the rGO sensor 412 of FIGS. 4A-4C, the temperature sensors 428, 430 of FIG. 4C, and/or the sensor(s) 564, 566 of FIG. 5 measure the temperature of the heat exchange fluid. In some examples, the sensor(s) 328, 564, 566 measure the pressure of the heat exchange fluid. Accordingly, the interface circuitry 810 receives a signal(s) indicative of the temperature and/or the pressure of the heat exchange fluid from the sensor(s) 328, 412, 428, 430, 564, 566. In turn, the valve control circuitry 820 (FIG. 8), the signal direction control circuitry 830, and/or the signal power control circuitry 840 (FIG. 8) determines the temperature and/or the pressure of the fluid based on the signal(s). In some examples, the signal direction control circuitry 830 determines the electrical signal is to be transmitted in the first direction for a predetermined period of time in response to an initialization of pump operations.

At block 906, the heat exchange control circuitry 326 determines whether the temperature of the fluid satisfies the first temperature threshold, the pressure of the fluid satisfies the first pressure threshold, and/or an amount of time that the electrical signal has been transmitted in the first direction satisfies a time threshold. For example, the valve control circuitry 820, the signal direction control circuitry 830, and/or the signal power control circuitry 840 determines whether the temperature of the fluid satisfies the first temperature threshold and/or whether the pressure of the fluid satisfies the first pressure threshold. Additionally or alternatively, the signal direction control circuitry 830 determines whether the electrical signal has been transmitted in the first direction for a period that satisfies (e.g., is greater than, is greater than or equal to) the time threshold. In response to the temperature of the fluid satisfying the first temperature threshold, the pressure of the fluid satisfying first pressure threshold, and/or the period of transmission of the electrical signal in the first direction satisfying the time threshold, the operations 900 proceed to block 908. Otherwise, the operations 900 repeat at block 906.

At block 908, the heat exchange control circuitry 326 causes transmission of an electrical signal to the annular heat exchanger in a second direction. For example, the signal direction control circuitry 830 causes transmission of the electrical signal in the second direction in response to the temperature of the fluid satisfying the first temperature threshold, the pressure of the fluid satisfying the first pressure threshold, and/or the period of transmission of the electrical signal in the first direction satisfying the time threshold. As a result, in response to causing transmission of the electrical signal in the second direction, the annular heat exchanger absorbs thermal energy from the fluid.

At block 910, the heat exchange control circuitry 326 controls an electric power of the electrical signal. For example, the signal power control circuitry 840 controls the electric power based on the temperature and/or the pressure of the fluid relative to a desired temperature and/or a desired pressure. In some examples, the signal power control circuitry 840 compares the temperature and/or the pressure of the fluid to various temperature thresholds (e.g., 425 K, 400

K, 375 K, etc.) and/or pressure thresholds (e.g., 2,000 psi, 1,750 psi, 1,500 psi, etc.). In such examples, the signal power control circuitry 840 causes the electrical signal to have an electric power corresponding to the threshold(s) satisfied by the pressure and/or the temperature of the fluid. In some examples, the temperature thresholds and/or the pressure thresholds are based on operating conditions, structural properties of the pump 304 of FIGS. 3A-3C, 4A-4C, and 5, and/or a desired temperature of a working fluid with which the fluid exchanges thermal energy.

At block 912, the heat exchange control circuitry 326 controls a position of one or more valves that control fluid flow through the annular heat exchanger. For example, the valve control circuitry 820 modulates the position(s) of one or more feedback valve(s) (e.g., the feedback valve(s) 322 of FIGS. 3A-3C, and/or 5, the first feedback valve 408 of FIGS. 4A-4C, and/or the second feedback valve 410 of FIGS. 4A-4C). In some examples, the positions of the valve(s) are controlled based on the operations associated with FIGS. 10-12.

At block 914, the heat exchange control circuitry 326 determines whether to continue operating. In response to the heat exchange control circuitry 326 determining the thermal management system is still active, the operations return to block 910. Otherwise, the operations 900 terminate.

Figure 10:
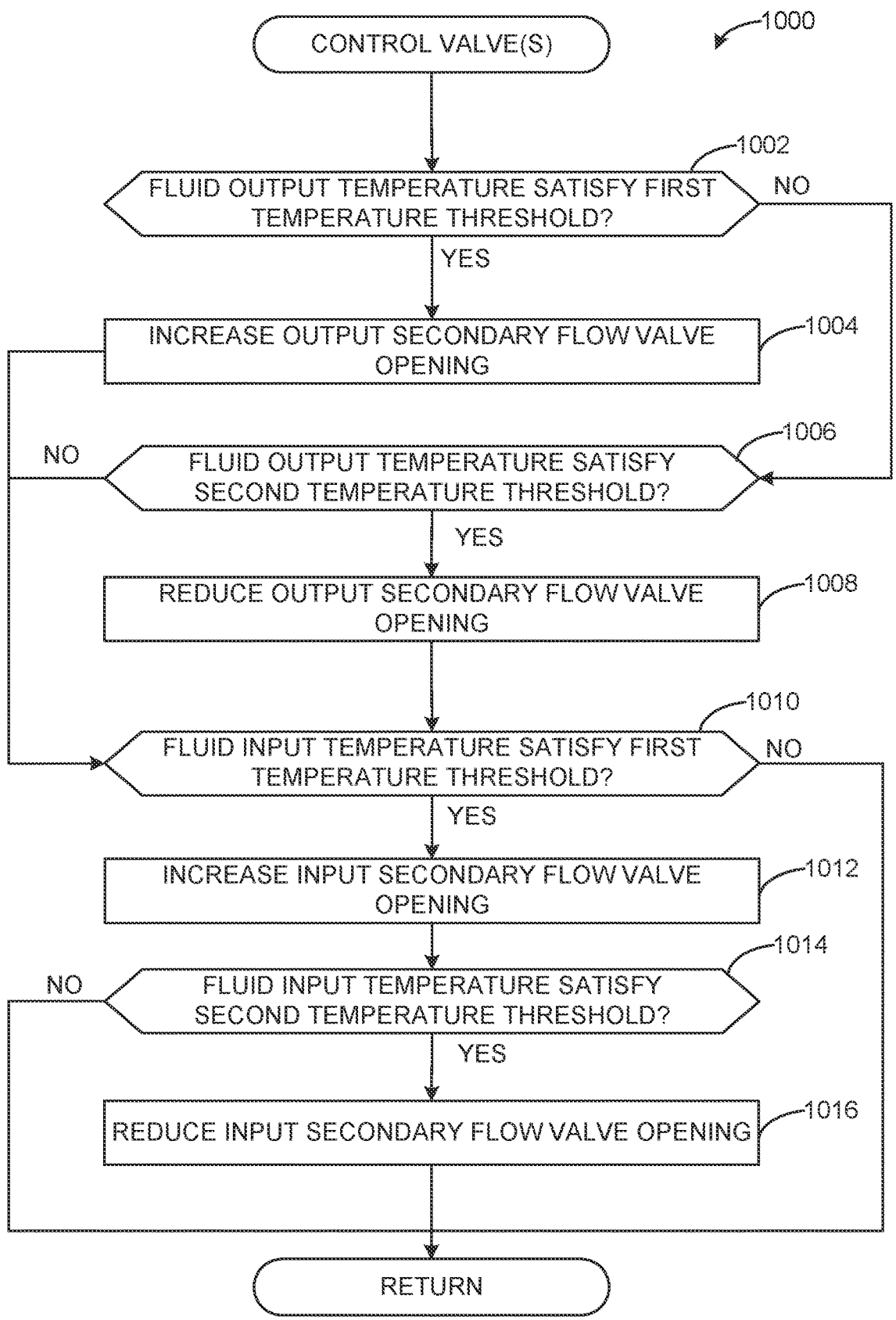
FIG. 10 is a flowchart representative of example machine readable instructions and/or example operations that may be executed by example processor circuitry to implement the heat exchange control circuitry of FIG. 8.

FIG. 10 is a first flowchart representative of example machine readable instructions and/or example operations 1000 that may be executed and/or instantiated by processor circuitry to control a fluid flow that encounters an annular heat exchanger in the thermal management system 360 of FIGS. 3C, 4A, 4B, and/or 4C. For example, the operations 1000 can correspond to block 912 of FIG. 9. The machine readable instructions and/or the operations 1000 of FIG. 10 begin at block 1002, at which the heat exchange control circuitry 326 (FIGS. 3A-3C, 4A-4C, 5, and/or 8) determines whether a fluid output temperature satisfies (e.g., is greater than, is greater than or equal to) a first temperature threshold (e.g., 500 K, 475 K, 450 K, etc.). For example, the valve control circuitry 820 (FIG. 8) determines whether the temperature of the fluid in, or flowing from, the output conduit 318 (e.g., a temperature of the fluid driven out of the pump 304, the temperature of the fluid in the second section 404 (FIGS. 4A-4C) of the feedback conduit 362) satisfies the first temperature threshold. In response to the fluid satisfying the first temperature threshold, the operations proceed to block 1004. Otherwise, the operations skip to block 1006.

At block 1004, the heat exchange control circuitry 326 increases an opening defined by a feedback valve that modulates flow between an output conduit and a feedback conduit. For example, the valve control circuitry 820 causes the feedback valve(s) 322 (FIGS. 3A-3C) that modulate the flow between the output conduit 318 and the feedback conduit 362 (FIG. 3C) to at least partially open. In some examples, the valve control circuitry 820 causes the second feedback valve 410 (FIGS. 4A-4C) to at least partially open in response to the fluid in, or flowing from, the output conduit 318 satisfying the first temperature threshold. As a result, the TEM 324 cools an increased portion of the fluid output. In response to adjusting the feedback valve, the operations 1000 skip to block 1010.

At block 1006, the heat exchange control circuitry 326 determines whether the fluid output temperature satisfies (e.g., is less than, is less than or equal to) a second temperature threshold (e.g., 400 K, 375 K, 350 K, etc.). In some examples, the valve control circuitry 820 determines whether the temperature of the fluid in, or flowing from, the output conduit 318 (e.g., the temperature of the fluid driven out of the pump 304, the temperature of the fluid in the second section 404 (FIGS. 4A-4C) of the feedback conduit 362) satisfies the second temperature threshold. In some examples, the second temperature threshold is defined by a lower temperature than the first temperature threshold. Thus, the first temperature threshold defines an upper limit associated with a desired temperature range of the output fluid, and the second temperature threshold defines a lower limit associated with the desired temperature range of the output fluid. In response to the temperature of the fluid satisfying the second temperature threshold, the operations 1000 proceed to block 1008. Otherwise, the operations 1000 skip to block 1010.

At block 1008, the heat exchange control circuitry 326 reduces an opening defined by a feedback valve that modulates flow between an output conduit and a feedback conduit. For example, the valve control circuitry 820 causes the feedback valve 322 that modulates the flow between the output conduit 318 and the feedback conduit(s) 362 to at least partially close. In some examples, the valve control circuitry 820 causes the second feedback valve 410 (FIGS. 4A-4C) to at least partially close in response to the fluid in, or flowing from, the output conduit 318 satisfying the second temperature threshold. As a result, the TEM 324 cools a reduced portion of the fluid output to enable a temperature of the fluid in the thermal management system 360 to increase.

At block 1010, the heat exchange control circuitry 326 determines whether a fluid input temperature satisfies (e.g., is greater than, is greater than or equal to) a third temperature threshold (e.g., 490 K, 465 K, 440 K, etc.). In some examples, the valve control circuitry 820 determines whether the temperature of the fluid in the input conduit 316 (e.g., the temperature of the fluid flowing towards the pump 304, the temperature of the fluid in the first section 402 (FIGS. 4A-4C) of the feedback conduit 362) satisfies the third temperature threshold. In some examples, the third temperature threshold is approximately the same as the first temperature threshold. In some other examples, the third temperature is less than the first temperature threshold. In response to the temperature of the fluid satisfying the third temperature threshold, the operations 1000 proceed to block 1012. Otherwise, the operations 1000 skip to block 1014.

At block 1012, the heat exchange control circuitry 326 increases an opening size defined by a feedback valve that modulates flow between an input conduit and a feedback conduit. For example, the valve control circuitry 820 causes the feedback valve 322 that modulates the flow between the input conduit 316 and the feedback conduit(s) 362 to at least partially open. In some examples, the valve control circuitry 820 causes the first feedback valve 408 (FIGS. 4A-4C) to at least partially open in response to the fluid in, or flowing from, the input conduit 316 satisfying the third temperature threshold. As a result, the TEM 324 cools an increased portion of the fluid input. In response to adjusting the feedback valve at block 1012, the operations 1000 terminate.

At block 1014, the heat exchange control circuitry 326 determines whether the fluid input temperature satisfies (e.g., is less than, is less than or equal to) a fourth temperature threshold (e.g., 390 K, 365 K, 340 K, etc.). In some examples, the valve control circuitry 820 determines whether the temperature of the fluid in, or flowing from, the input conduit 316 satisfies the fourth temperature threshold. In some examples, the fourth temperature threshold is defined by a lower temperature than the third temperature threshold because the fluid may be compressed and, in turn, heated by the pump 304. Thus, the third temperature threshold defines an upper limit associated with a desired temperature range of the input fluid, and the fourth temperature threshold defines a lower limit associated with the desired temperature range of the input fluid.

At block 1016, the heat exchange control circuitry 326 reduces an opening size defined by the feedback valve that modulates flow between the input conduit and the feedback conduit. For example, the valve control circuitry 820 causes the feedback valve 322 that modulates the flow between the input conduit 316 and the feedback conduit(s) 362 to at least partially close. In some examples, the valve control circuitry 820 causes the first feedback valve 408 to at least partially close in response to the fluid in, or flowing from, the input conduit 316 satisfying the fourth temperature threshold. As a result, the TEM 324 cools a reduced portion of the fluid input.

Figure 11:
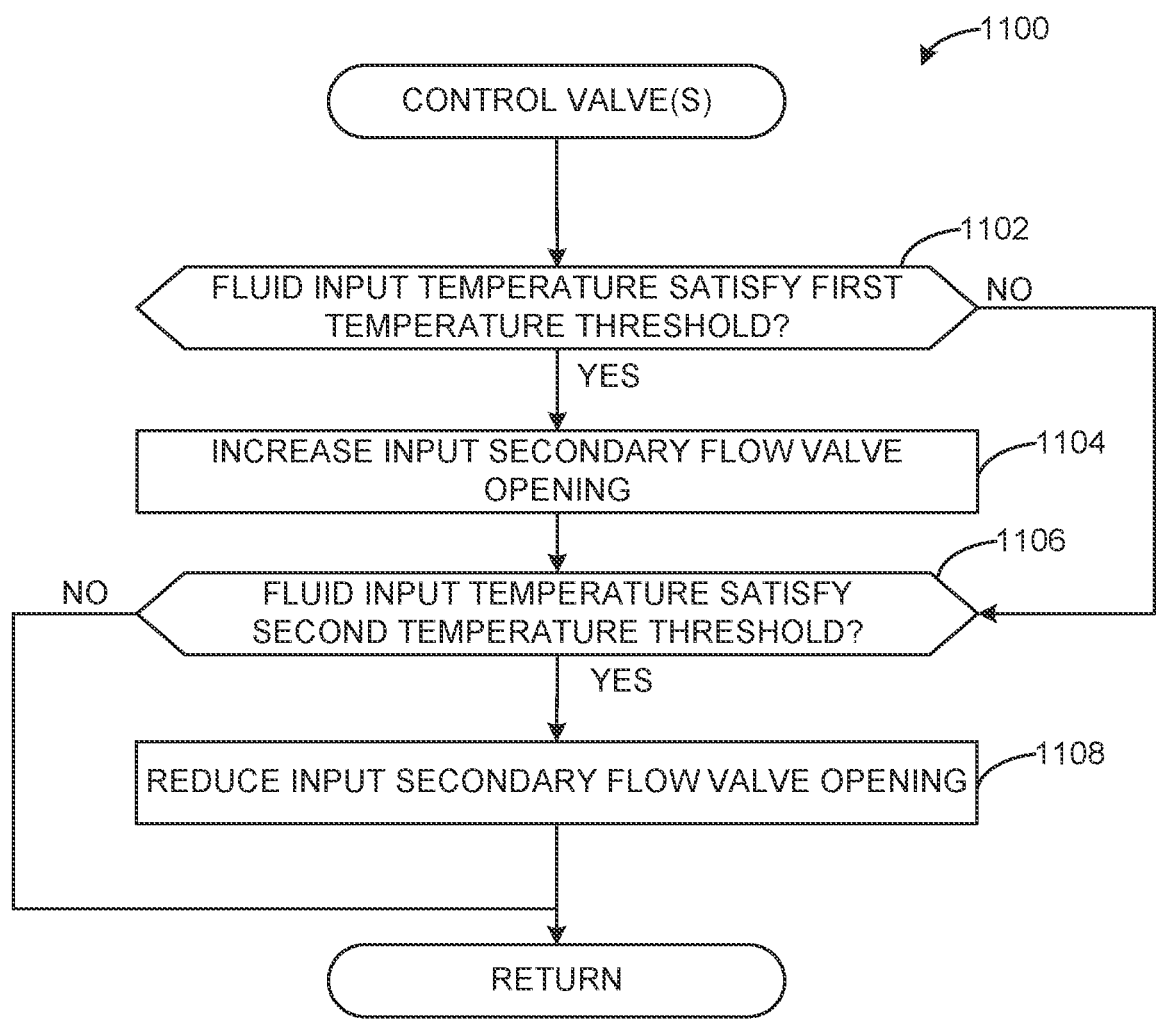
FIG. 11 is a flowchart representative of example machine readable instructions and/or example operations that may be executed by example processor circuitry to implement the heat exchange control circuitry of FIG. 8.

FIG. 11 is a second flowchart representative of example machine readable instructions and/or example operations 1100 that may be executed and/or instantiated by processor circuitry to control a fluid flow that encounters an annular heat exchanger (e.g., the TEM 324 of FIGS. 3A-3C, 4A-4C, 5, and/or 6, the first TEM 702 of FIG. 7, the second TEM 704 of FIG. 7) in the thermal management system 330 of FIG. 3B. The machine readable instructions and/or the operations 1100 of FIG. 11 begin at block 1102, at which the heat exchange control circuitry 326 determines whether determines whether a fluid input temperature satisfies (e.g., is greater than, is greater than or equal to) a first temperature threshold (e.g., 500 K, 475 K, 450 K, etc.). In some examples, the valve control circuitry 820 determines whether the temperature of the fluid in the input conduit 316 (e.g., the temperature of the fluid flowing towards the pump 304) satisfies the first temperature threshold. In response to the temperature of the input fluid satisfying the first temperature threshold, the operations 1100 proceed to block 1104. Otherwise, the operations 1100 skip to block 1106.

At block 1104, the heat exchange control circuitry 326 increases an opening size defined by a feedback valve that modulates flow between an input conduit and a feedback conduit. For example, the valve control circuitry 820 causes the feedback valve 322 that modulates the flow between the input conduit 316 and the feedback conduit(s) 332 to at least partially open. In some examples, the valve control circuitry 820 causes the feedback valve 322 to at least partially open in response to the fluid in, or flowing from, the input conduit 316 satisfying the first temperature threshold. As a result, the TEM 324 cools an increased portion of the fluid input. In response to adjusting the feedback valve at block 1104, the operations 1100 terminate.

At block 1106, the heat exchange control circuitry 326 determines whether the fluid input temperature satisfies (e.g., is less than, is less than or equal to) a second temperature threshold (e.g., 400 K, 375 K, 350 K, etc.). In some examples, the valve control circuitry 820 determines whether the temperature of the fluid in, or flowing from, the input conduit 316 satisfies the second temperature threshold. In some examples, the second temperature threshold is defined by a lower temperature than the first temperature threshold. Thus, the first temperature threshold defines an upper limit associated with a desired temperature range of the input fluid and the second temperature threshold defines a lower limit associated with the desired temperature range of the input fluid. In response to the temperature of the fluid input satisfying the second temperature threshold, the operations 1100 proceed to block 1108. Otherwise, the operations 1100 terminate.

At block 1108, the heat exchange control circuitry 326 reduces an opening size defined by the feedback valve that modulates flow between the input conduit and the feedback conduit. For example, the valve control circuitry 820 causes the feedback valve 322 that modulates the flow between the input conduit 316 and the feedback conduit(s) 332 (FIG. 3B) to at least partially close. As a result, the TEM 324 cools a reduced portion of the fluid input to help maintain the fluid input within the desired temperature range.

Figure 12:
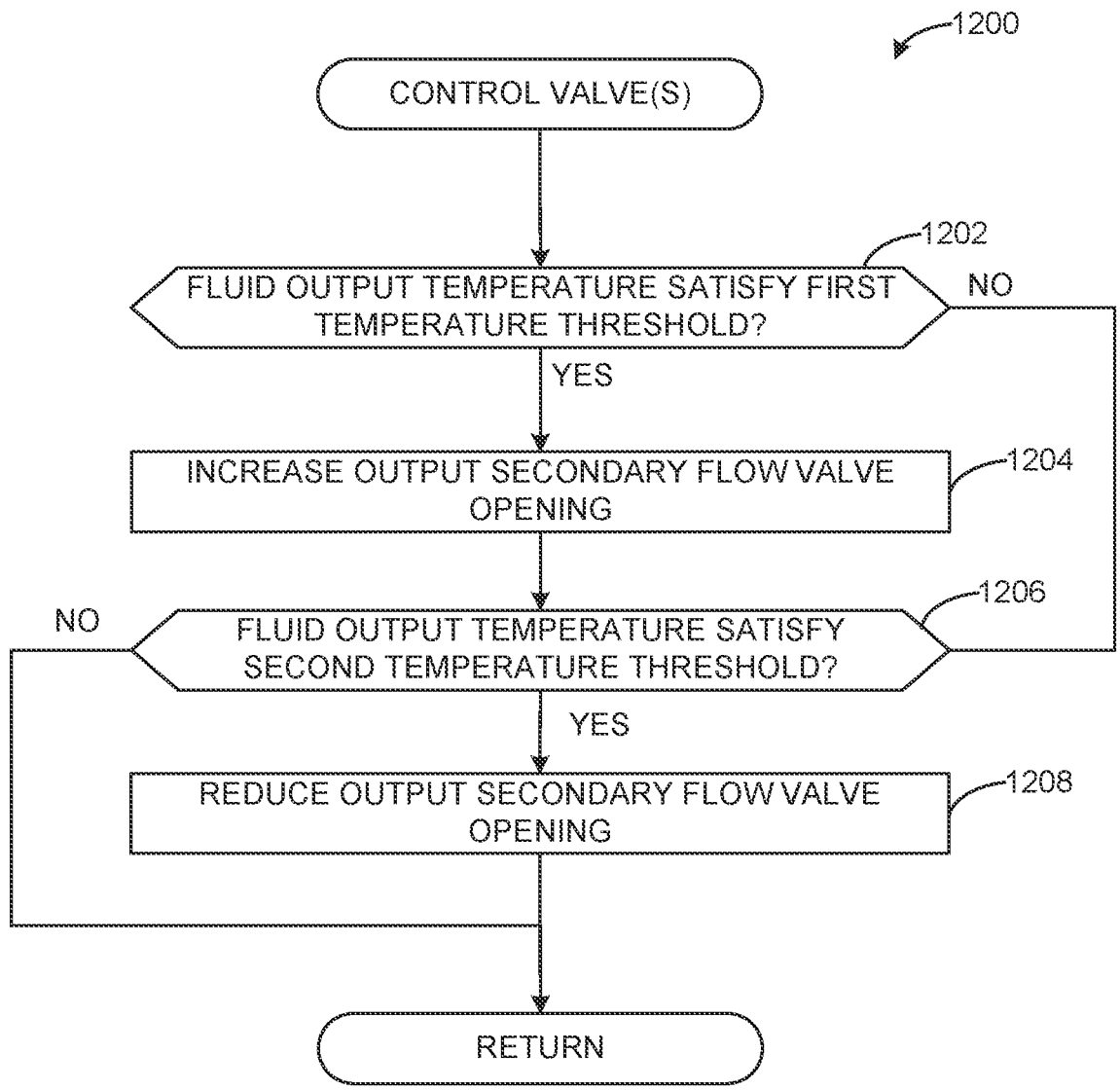
FIG. 12 is a flowchart representative of example machine readable instructions and/or example operations that may be executed by example processor circuitry to implement the heat exchange control circuitry of FIG. 8.

FIG. 12 is a third flowchart representative of example machine readable instructions and/or example operations 1200 that may be executed and/or instantiated by processor circuitry to control a fluid flow that encounters an annular heat exchanger (e.g., the TEM 324 of FIGS. 3A and/or 5) in the thermal management system 300 of FIG. 3A. The machine readable instructions and/or the operations 1200 of FIG. 12 begin at block 1202, at which the heat exchange control circuitry 326 determines whether determines whether a fluid output temperature satisfies (e.g., is greater than, is greater than or equal to) a first temperature threshold (e.g., 500 K, 475 K, 450 K, etc.). In some examples, the valve control circuitry 820 determines whether the temperature of the fluid in the output conduit 318 (e.g., the temperature of the fluid flowing away from the pump 304) satisfies the first temperature threshold. In response to the temperature of the output fluid satisfying the first temperature threshold, the operations 1200 proceed to block 1204. Otherwise, the operations 1200 skip to block 1206.

At block 1204, the heat exchange control circuitry 326 increases an opening size defined by a feedback valve that modulates flow between an output conduit (e.g., the output conduit 318) and one or more feedback conduits (e.g., the feedback conduit(s) 320 of FIGS. 3A, 5, and/or 7). For example, the valve control circuitry 820 causes the feedback valve 322 that modulates the flow between the output conduit 318 and the feedback conduit(s) 320 to at least partially open. In some examples, the valve control circuitry 820 causes the feedback valve 322 to at least partially open in response to the fluid in, or flowing from, the output conduit 318 satisfying the first temperature threshold. As a result, the TEM 324 cools an increased portion of the fluid input. In response to adjusting the feedback valve at block 1204, the operations 1200 terminate.

At block 1206, the heat exchange control circuitry 326 determines whether the fluid output temperature satisfies (e.g., is less than, is less than or equal to) a second temperature threshold (e.g., 400 K, 375 K, 350 K, etc.). In some examples, the valve control circuitry 820 determines whether the temperature of the fluid in, or flowing from, the output conduit 318 satisfies the second temperature threshold. In some examples, the second temperature threshold is defined by a lower temperature than the first temperature threshold. Thus, the first temperature threshold defines an upper limit associated with a desired temperature range of the output fluid and the second temperature threshold defines a lower limit associated with the desired temperature range of the output fluid. In response to the temperature of the output fluid satisfying the second temperature threshold, the operations 1200 proceed to block 1208. Otherwise, the operations 1200 terminate.

At block 1208, the heat exchange control circuitry 326 reduces an opening size defined by the feedback valve that modulates flow between the output conduit 318 and the feedback conduit(s) 320. For example, the valve control circuitry 820 causes the feedback valve 322 that modulates the flow between the output conduit 318 and the feedback conduit(s) 320 to at least partially close. As a result, the TEM 324 cools a reduced portion of the fluid output from the pump 304 to help maintain the fluid output and/or the pump 304 within the desired temperature range.

Figure 13:
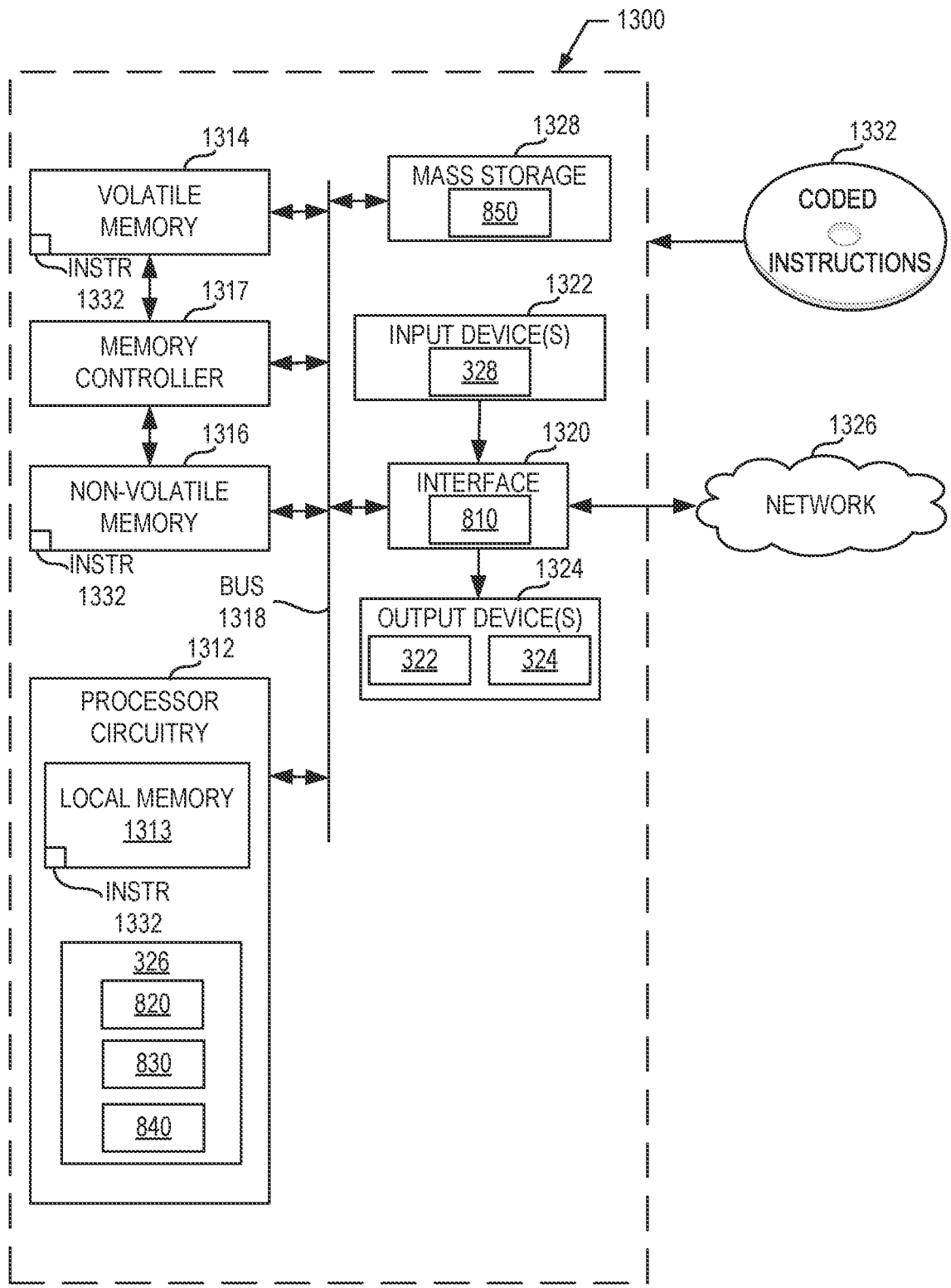
FIG. 13 is a block diagram of an example processing platform including processor circuitry structured to execute the example machine readable instructions and/or the example operations of FIGS. 9-12 to implement the heat exchange control circuitry of FIG. 8.

FIG. 13 is a block diagram of an example processor platform 1300 structured to execute and/or instantiate the machine readable instructions and/or the operations of FIGS. 9-12 to implement the heat exchange control circuitry 326 of FIG. 8. The processor platform 1300 can be, for example, a digital computer (e.g., a FADEC, an EEC, an ECU, etc.) or any other type of computing device.

The processor platform 1300 of the illustrated example includes processor circuitry 1312. The processor circuitry 1312 of the illustrated example is hardware. For example, the processor circuitry 1312 can be implemented by one or more integrated circuits, logic circuits, FPGAs, microprocessors, CPUs, GPUs, DSPs, and/or microcontrollers from any desired family or manufacturer. The processor circuitry 1312 may be implemented by one or more semiconductor based (e.g., silicon based) devices. In this example, the processor circuitry 1312 implements the valve control circuitry 820, the signal direction control circuitry 830, and the signal power control circuitry 840.

The processor circuitry 1312 of the illustrated example includes a local memory 1313 (e.g., a cache, registers, etc.). The processor circuitry 1312 of the illustrated example is in communication with a main memory including a volatile memory 1314 and a non-volatile memory 1316 by a bus 1318. The volatile memory 1314 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1316 may be implemented by flash memory and/or any other desired type of memory device. Access to the main memory 1314, 1316 of the illustrated example is controlled by a memory controller 1317.

The processor platform 1300 of the illustrated example also includes interface circuitry 1320. The interface circuitry 1320 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1322 are connected to the interface circuitry 1320. The input device(s) 1322 permit(s) a user to enter data and/or commands into the processor circuitry 1312. The input device(s) 1322 can be implemented by, for example, an audio sensor, a pressure sensor, a temperature sensor, a position sensor, and/or any other sensor. In this example, the input device(s) 1322 implement the sensor(s) 328.

One or more output devices 1324 are also connected to the interface circuitry 1320 of the illustrated example. The output device(s) 1324 can be implemented, for example, by one or more actuator(s) and/or one or more heat exchanger(s). In this example, the output device(s) 1324 implement the feedback valves 322 and the TEM 324. The interface circuitry 1320 of the illustrated example, thus, typically includes a graphics driver card, a graphics driver chip, and/or graphics processor circuitry such as a GPU.

The interface circuitry 1320 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1326. The communication can be by, for example, an Ethernet connection, a digital subscriber line (DSL) connection, a telephone line connection, a coaxial cable system, a satellite system, a line-of-site wireless system, a cellular telephone system, an optical connection, etc. In this example, the interface circuitry 1320 implements the interface circuitry 810.

The processor platform 1300 of the illustrated example also includes one or more mass storage devices 1328 to store software and/or data. Examples of such mass storage devices 1328 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives. In this example, the mass storage device(s) 1328 implement the database 850.

The machine readable instructions 1332, which may be implemented by the machine readable instructions of FIGS. 9-12, may be stored in the mass storage device 1328, in the volatile memory 1314, in the non-volatile memory 1316, and/or on a removable non-transitory computer readable storage medium such as a CD or DVD.

From the foregoing, it will be appreciated that example pump systems having dual-function heat exchangers are disclosed. An example pump system can have one or more dual-function heat exchangers to heat or cool a fluid depending on characteristics of the fluid and/or the pump system. For example, the dual-function heat exchanger(s) can heat the fluid to maintain the fluid in a certain state (e.g., a supercritical state) or cool the fluid to enable the fluid to cool pump components (e.g., a motor, bearings, etc.), which reduces vibrations and/or damage encountered by the pump and improves a stability, a reliability, and/or a lifespan of the pump. Furthermore, the dual-function heat exchanger(s) can surround respective portions of a secondary flow conduit to maximize or otherwise increase a surface area across which the dual-function heat exchanger(s) can exchange thermal energy with the fluid in the secondary flow conduit.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

Further aspects of the present disclosure are provided by the subject matter of the following clauses:

Example 1 includes a pump system to pressurize a fluid within a closed loop transport bus, the pump system comprising a pump to move the fluid, a conduit in fluid connection with the pump, and a heat exchanger positioned around at least a portion of the conduit, the heat exchanger to receive a first electrical signal transmitted in a first direction at a first time and a second electrical signal transmitted in a second direction at a second time different from the first time, the second direction opposite the first direction.

Example 2 includes the pump system of any preceding clause, further including processor circuitry to cause transmission of the electrical signal in the first direction in response to at least one of a temperature of the fluid not satisfying a temperature threshold, a pressure of the fluid not satisfying a pressure threshold, or a period for which the electrical signal has been transmitted in the first direction not satisfying a time threshold, and cause transmission of the electrical signal in the second direction in response to at least one of the temperature of the fluid satisfying the temperature threshold, the pressure of the fluid satisfying the pressure threshold, or the period for which the electrical signal has been transmitted in the first direction satisfying the time threshold.

Example 3 includes the pump system of any preceding clause, wherein the heat exchanger increases the temperature of the fluid in the conduit in response to the electrical signal being transmitted in the first direction, and wherein the heat exchanger reduces the temperature of the fluid in the conduit in response to the electrical signal being transmitted in the second direction.

Example 4 includes the pump system of any preceding clause, wherein the temperature threshold is a first temperature threshold and the pressure threshold is a first pressure threshold, wherein the processor circuitry is to cause the electrical signal to have a first electric power in response to at least one of the temperature of the fluid satisfying a second temperature threshold or the pressure of the fluid satisfying a second pressure threshold, and cause the electrical signal to have a second electric power different from the first electric power in response to at least one of the temperature of the fluid satisfying a third temperature threshold or the pressure of the fluid satisfying a third pressure threshold.

Example 5 includes the pump system of any preceding clause, wherein the heat exchanger includes an inner annular housing in contact with an exterior surface of the conduit.

Example 6 includes the pump system of any preceding clause, wherein the heat exchanger includes inner fins extending centripetally from the inner annular housing, the inner fins to extend past an outer circumference defined by a portion of the exterior surface of the conduit.

Example 7 includes the pump system of any preceding clause, wherein the heat exchanger further includes an outer annular housing positioned around the inner annular housing, and junctions positioned between the inner annular housing and the outer annular housing, the junctions including metal plates to couple N-type semiconductors to P-type semiconductors, the metal plates to separate the N-type semiconductors and the P-type semiconductors from the inner annular housing and the outer annular housing.

Example 8 includes the pump system of any preceding clause, wherein the heat exchanger includes outer fins extending radially outward from the outer annular housing.

Example 9 includes the pump system of any preceding clause, wherein the inner annular housing includes at least one of cobalt or cerium-palladium.

Example 10 includes the pump system of any preceding clause, wherein the heat exchanger is a first annular heat exchanger positioned around a first portion of the conduit, further including a second annular heat exchanger positioned around a second portion of the conduit downstream of the first portion.

Example 11 includes the pump system of any preceding clause, wherein the conduit is a first conduit, a first end of the first conduit fluidly coupled to a first inlet of the pump, further including a second conduit including a second end fluidly coupled to a second inlet of the pump or an outlet of the pump, the second conduit in fluid connection with the first conduit, and a valve to control a flow rate of a portion of the fluid that flows from the second conduit into the first conduit, the processor circuitry to modulate a position of the valve based on at least one of the temperature or the pressure of the fluid.

Example 12 includes the pump system of any preceding clause, wherein the valve is a first valve, the flow rate is a first flow rate, the portion of the fluid is a first portion, and the position of the valve is a first position, further including a third conduit including a third end fluidly coupled to the outlet of the pump, the third conduit in fluid connection with the first conduit, and a second valve to control a second flow rate of a second portion of the fluid between the third conduit and the first conduit, the processor circuitry to modulate a second position of the second valve based on at least one of the temperature or the pressure of the fluid.

Example 13 includes a system comprising a fluid pump including an inlet, a conduit in fluid connection with the inlet, and a thermoelectric module including an annular inner housing in contact with the conduit, the thermoelectric module to reduce a thermal energy of the fluid in response to a first electrical signal traveling through the thermoelectric module in a first direction.

Example 14 includes the system of any preceding clause, wherein the thermoelectric module is to increase the thermal energy of the fluid in response to a second electrical signal traveling through the thermoelectric module in a second direction opposite the first direction.

Example 15 includes the system of any preceding clause, further including processor circuitry to cause transmission of the first electrical signal in response to at least one of a temperature of the fluid not satisfying a temperature threshold, a pressure of the fluid not satisfying a pressure threshold, or the period for which the electrical signal has been transmitted in the first direction not satisfying the time threshold, and cause transmission of the second electrical signal in response to at least one of the temperature of the fluid satisfying the temperature threshold, the pressure of the fluid satisfying the pressure threshold, or the period for which the electrical signal has been transmitted in the first direction satisfying the time threshold.

Example 16 includes the system of any preceding clause, wherein the inlet is a first inlet and the conduit is a first conduit, wherein the pump further includes a second inlet and an outlet, further including a second conduit in fluid connection with the second inlet and a third conduit in fluid connection with the outlet, wherein the first conduit is in fluid connection with at least one of the second conduit or the third conduit, the first conduit to define a flow path for fluid to flow from at least one of the second conduit or the third conduit to the first inlet.

Example 17 includes the system of any preceding clause, further including a first valve positioned between the second conduit and the first conduit, a second valve positioned between the third conduit and the first conduit, and processor circuitry to cause the first valve to at least partially open in response to a temperature of the fluid satisfying a temperature threshold, and cause the second valve to at least partially open in response to the temperature of the fluid not satisfying the temperature threshold.

Example 18 includes the system of any preceding clause, further including a reduced graphene oxide sensor positioned between the thermoelectric module and the fluid pump, the reduced graphene oxide sensor having an electrical conductivity that corresponds with the thermal energy of the fluid, an electric power provided to the thermoelectric module based on the electrical conductivity of the reduced graphene oxide sensor.

Example 19 includes an apparatus comprising means for pumping a first fluid, means for transporting the first fluid fluidly coupled to the means for pumping, means for returning the first fluid to the means for pumping the first fluid fluidly coupled to the means for transporting, and means for adjusting a first thermal energy of the first fluid in the means for returning, the means for adjusting the first thermal energy of the first fluid including means for increasing the first thermal energy of the first fluid or a second thermal energy of a second fluid, the means for adjusting the first thermal energy of the first fluid including means for decreasing the first thermal energy of the first fluid or the second thermal energy of the second fluid.

Example 20 includes the apparatus of any preceding clause, further including means for controlling the means for adjusting the first thermal energy of the first fluid, the means for controlling to cause the means for increasing the first thermal energy to be in contact with the means for returning in response at least one of a pressure of the first fluid not satisfying a pressure threshold or a temperature of the first fluid not satisfying a temperature threshold, the means for controlling to cause the means for decreasing the first thermal energy to be in contact with the means for returning in response to at least one of the pressure of the first fluid satisfying the pressure threshold or the temperature of the first fluid satisfying the temperature threshold.

Example 21 includes a pump system to pressurize a fluid within a closed loop transport bus, the pump system comprising a pump to move the fluid, a conduit in fluid connection with the pump, a heat exchanger positioned around at least a portion of the conduit, and processor circuitry to cause transmission of an electrical signal to the heat exchanger in at least one of a first direction or a second direction opposite the first direction based on at least one of a temperature, a pressure of the fluid, or a period for which the electrical signal has been transmitted in the first direction or the second direction.

Example 22 includes a system comprising a fluid pump including a first inlet, a second inlet, and an outlet, an input conduit in fluid connection with the first inlet, an output conduit in fluid connection with the outlet, a feedback conduit in fluid connection with the second inlet of the fluid pump and at least one of the input conduit or the output conduit, the feedback conduit to define a flow path for fluid to flow from at least one of the input conduit or the output conduit to the second inlet, and a thermoelectric module including an annular inner housing in contact with the feedback conduit, the thermoelectric module to reduce a thermal energy of the fluid in response to a first electrical signal traveling through the thermoelectric module in a first direction.

Example 23 is an apparatus comprising an annular inner housing, an annular outer housing positioned around the annular inner housing, junctions positioned between the annular inner housing and the annular outer housing, the junctions including N-type semiconductors, P-type semiconductors, inner circumferential metal plates coupled to first ends of the N-type semiconductors and the P-type semiconductors, and outer circumferential metal plates coupled to second ends of the N-type semiconductors and the P-type semiconductors, and an electric power source electrically coupled to the junctions, the electric power source to transmit a first signal in a first direction to increase a temperature of the annular inner housing, the electric power source to transmit a second signal in a second direction to reduce the temperature of the annular inner housing.

Example 24 includes the pump system of any preceding clause, further including a graphene oxide sensor operatively coupled to the conduit between the annular heat exchanger and the pump, the graphene oxide sensor to adjust a power received by the annular heat exchanger based on the temperature of the fluid in response to the electrical signal flowing through the annular heat exchanger in the second direction.

Example 25 includes the pump system of any preceding clause, wherein the electrical signal travels through the graphene oxide sensor in advance of traveling through the annular heat exchanger in response to the processor circuitry causing transmission of the electrical signal in the second direction, an electrical conductivity of the reduced graphene oxide sensor to cause the power received by the annular heat exchanger to be directly related to the temperature of the fluid encountered by the graphene oxide sensor.

Example 26 includes the system of any preceding clause, further including at least one sensor operatively coupled to the first inlet, the at least one sensor to measure the temperature of the fluid and the pressure of the fluid.

Example 27 includes the system of any preceding clause, wherein at most 10% of the fluid in the outlet conduit flows into the feedback conduit.

Example 28 includes the apparatus of any preceding clause, wherein the first fluid is supercritical carbon dioxide and the second fluid is air.

Example 29 is a method comprising causing transmission of an electrical signal to an annular heat exchanger in a first direction, the annular heat exchanger positioned around a conduit that defines a flow path of a fluid, measuring at least one of a temperature or a pressure of the fluid, comparing at least one of (i) the temperature to a temperature threshold or (ii) the pressure to a pressure threshold, in response to at least one of (i) the temperature satisfying the temperature threshold or (ii) the pressure satisfying the pressure threshold, adjusting the transmission of the electrical signal to the annular heat exchanger from the first direction to a second direction, the second direction in an opposite direction from the first direction.

Example 30 includes the method of any preceding example, further including measuring at least one of the temperature or the pressure of the fluid in response to adjusting the transmission of the electrical signal to the second direction, and controlling an electric power of the electrical signal based on at least one of the temperature or the pressure of the fluid.

Example 31 includes the method of any preceding example, wherein the conduit is a feedback conduit in fluid connection with an input conduit and an output conduit, the input conduit in fluid connection with a first inlet of a pump, the feedback conduit in fluid connection with a second inlet of the pump, the output conduit in fluid connection with an outlet of the pump, wherein the temperature includes at least one of an output fluid temperature or an input fluid temperature, further including comparing the output fluid temperature to a second temperature threshold, in response to the output fluid temperature satisfying the second temperature threshold, at least partially opening an output valve to increase a first flow rate of the fluid that flows from the output conduit through the feedback conduit.

Example 32 includes the method of any preceding example, further including comparing the output fluid temperature to a third temperature threshold, and in response to the output fluid temperature satisfying the third temperature threshold, at least partially closing the output valve to reduce the first flow rate of the fluid that flows from the output conduit through the feedback conduit.

Example 33 includes the method of any preceding example, further including comparing the input fluid temperature to a fourth temperature threshold, and in response to the input fluid temperature satisfying the fourth temperature threshold, at least partially opening an input valve to increase a second flow rate of the fluid that flows from the input conduit through the feedback conduit.

Example 34 includes the method of any preceding example, further including comparing the input fluid temperature to a fifth temperature threshold, and in response to the input fluid temperature satisfying the fifth temperature threshold, at least partially closing the input valve to reduce the second flow rate of the fluid that flows from the input conduit through the feedback conduit.

Example 35 includes an apparatus comprising memory and processor circuitry to cause transmission of an electrical signal to an annular heat exchanger in a first direction, the annular heat exchanger positioned around a conduit that defines a flow path of a fluid, measure at least one of a temperature or a pressure of the fluid, compare at least one of (i) the temperature to a temperature threshold or (ii) the pressure to a pressure threshold, in response to at least one of (i) the temperature satisfying the temperature threshold or (ii) the pressure satisfying the pressure threshold, adjust the transmission of the electrical signal to the annular heat exchanger from the first direction to a second direction, the second direction in an opposite direction from the first direction.

Example 36 includes the apparatus of any preceding example, wherein the processor circuitry is to determine at least one of the temperature or the pressure of the fluid in response to adjusting the transmission of the electrical signal to the second direction, and control an electric power of the electrical signal based on at least one of the temperature or the pressure of the fluid.

Example 37 includes the apparatus of any preceding example, wherein the conduit is a feedback conduit in fluid connection with an input conduit and an output conduit, the input conduit in fluid connection with a first inlet of a pump, the feedback conduit in fluid connection with a second inlet of the pump, the output conduit in fluid connection with an outlet of the pump, wherein the temperature includes at least one of an output fluid temperature or an input fluid temperature, wherein the processor circuitry is to compare the output fluid temperature to a second temperature threshold, and, in response to the output fluid temperature satisfying the second temperature threshold, cause an output valve to at least partially open to increase a first flow rate of the fluid that flows from the output conduit through the feedback conduit.

Example 38 includes the apparatus of any preceding example, wherein the processor circuitry is to compare the output fluid temperature to a third temperature threshold, and, in response to the output fluid temperature satisfying the third temperature threshold, cause the output valve to at least partially close to reduce the first flow rate of the fluid that flows from the output conduit through the feedback conduit.

Example 39 includes the apparatus of any preceding example, wherein the processor circuitry is to compare the input fluid temperature to a fourth temperature threshold, and, in response to the input fluid temperature satisfying the fourth temperature threshold, cause an input valve to at least partially open to increase a second flow rate of the fluid that flows from the input conduit through the feedback conduit.

Example 40 includes the apparatus of any preceding example, wherein the processor circuitry is to compare the input fluid temperature to a fifth temperature threshold, and, in response to the input fluid temperature satisfying the fifth temperature threshold, cause the input valve to at least partially close to reduce the second flow rate of the fluid that flows from the input conduit through the feedback conduit.

Example 41 includes the pump system of any preceding clause, wherein the heat exchanger is positioned around at least half of a perimeter of the portion of the conduit.

Example 42 includes the pump system of any preceding clause, wherein the heat exchanger is positioned around at least two thirds of a perimeter of the portion of the conduit.

Example 43 includes the pump system of any preceding clause, wherein the heat exchanger is positioned around at least three quarters of a perimeter of the portion of the conduit.

Example 44 includes the pump system of any preceding clause, wherein the heat exchanger surrounds a perimeter of the portion of the conduit.

Example 45 includes the pump system of any preceding clause, wherein a change from the first electrical signal to the second electrical signal is based on at least one of a temperature of the fluid, a pressure of the fluid, or a period for which the heat exchanger has received the first electrical signal.

What is claimed is:

1. A pump system to pressurize a fluid within a closed loop transport bus, the pump system comprising:
   a pump to move the fluid;
   a first conduit in fluid connection with the pump, wherein a first end of the first conduit fluidly coupled to a first inlet of the pump;
   a heat exchanger positioned around at least a portion of the first conduit, the heat exchanger to receive a first electrical signal transmitted in a first direction at a first time and a second electrical signal transmitted in a second direction at a second time different from the first time, the second direction opposite the first direction;
   a second conduit including a second end fluidly coupled to a second inlet of the pump or an outlet of the pump, the second conduit in fluid connection with the first conduit; and
   a valve to control a flow rate of a portion of the fluid that flows from the second conduit into the first conduit, wherein processor circuitry is to modulate a position of the valve based on at least one of a temperature or a pressure of the fluid.

2. The pump system of claim 1, further including processor circuitry to:
   cause transmission of the first electrical signal in the first direction in response to at least one of a temperature of the fluid not satisfying a temperature threshold, a pressure of the fluid not satisfying a pressure threshold, or a period for which the electrical signal has been transmitted in the first direction not satisfying a time threshold; and
   cause transmission of the second electrical signal in the second direction in response to at least one of the temperature of the fluid satisfying the temperature threshold, the pressure of the fluid satisfying the pressure threshold, or the period for which the electrical signal has been transmitted in the first direction satisfying the time threshold.

3. The pump system of claim 2, wherein the heat exchanger increases the temperature of the fluid in the first conduit in response to the electrical signal being transmitted in the first direction, and wherein the heat exchanger reduces the temperature of the fluid in the first conduit in response to the electrical signal being transmitted in the second direction.

4. The pump system of claim 3, wherein the temperature threshold is a first temperature threshold and the pressure threshold is a first pressure threshold, wherein the processor circuitry is to:
- cause the electrical signal to have a first electric power in response to at least one of the temperature of the fluid satisfying a second temperature threshold or the pressure of the fluid satisfying a second pressure threshold; and
- cause the electrical signal to have a second electric power different from the first electric power in response to at least one of the temperature of the fluid satisfying a third temperature threshold or the pressure of the fluid satisfying a third pressure threshold.

5. The pump system of claim 1, wherein the heat exchanger includes an inner annular housing in contact with an exterior surface of the first conduit.

6. The pump system of claim 5, wherein the heat exchanger includes inner fins extending centripetally from the inner annular housing, the inner fins to extend past an outer circumference defined by a portion of the exterior surface of the first conduit.

7. The pump system of claim 5, wherein the inner annular housing includes at least one of cobalt or cerium-palladium.

8. The pump system of claim 1, wherein the heat exchanger is a first annular heat exchanger positioned around a first portion of the first conduit, further including a second annular heat exchanger positioned around a second portion of the first conduit downstream of the first portion.

9. The pump system of claim 1, wherein the valve is a first valve, the flow rate is a first flow rate, the portion of the fluid is a first portion, and the position of the valve is a first position, further including:
- a third conduit including a third end fluidly coupled to the outlet of the pump, the third conduit in fluid connection with the first conduit; and
- a second valve to control a second flow rate of a second portion of the fluid between the third conduit and the first conduit, the processor circuitry to modulate a second position of the second valve based on at least one of the temperature or the pressure of the fluid.

10. A pump system to pressurize a fluid within a closed loop transport bus, the pump system comprising:
- a pump to move the fluid;
- a conduit in fluid connection with the pump; and
- a heat exchanger positioned around at least a portion of the conduit, the heat exchanger to receive a first electrical signal transmitted in a first direction at a first time and a second electrical signal transmitted in a second direction at a second time different from the first time, the second direction opposite the first direction, wherein the heat exchanger further includes:
- an inner annular housing in contact with an exterior surface of the conduit;
- an outer annular housing positioned around the inner annular housing; and
- junctions positioned between the inner annular housing and the outer annular housing, the junctions including metal plates to couple N-type semiconductors to P-type semiconductors, the metal plates to separate the N-type semiconductors and the P-type semiconductors from the inner annular housing and the outer annular housing.

11. The pump system of claim 10, wherein the heat exchanger includes outer fins extending radially outward from the outer annular housing.

12. The pump system of claim 10, wherein the heat exchanger includes inner fins extending centripetally from the inner annular housing, the inner fins to extend past an outer circumference defined by a portion of the exterior surface of the conduit.

13. The pump system of claim 12, wherein the inner annular housing includes at least one of cobalt or cerium-palladium.

14. The pump system of claim 10, wherein the conduit is a first conduit, a first end of the first conduit fluidly coupled to a first inlet of the pump, further including:
- a second conduit including a second end fluidly coupled to a second inlet of the pump or an outlet of the pump, the second conduit in fluid connection with the first conduit; and
- a valve to control a flow rate of a portion of the fluid that flows from the second conduit into the first conduit, wherein processor circuitry is to modulate a position of the valve based on at least one of a temperature or a pressure of the fluid.

15. A system comprising:
- a fluid pump including an inlet;
- a conduit in fluid connection with the inlet;
- a thermoelectric module including an annular inner housing in contact with the conduit, the thermoelectric module to reduce a thermal energy of a fluid driven by the fluid pump in response to a first electrical signal traveling through the thermoelectric module in a first direction; and
- a reduced graphene oxide sensor positioned between the thermoelectric module and the fluid pump, the reduced graphene oxide sensor having an electrical conductivity that corresponds with the thermal energy of the fluid, an electric power provided to the thermoelectric module based on the electrical conductivity of the reduced graphene oxide sensor.

16. The system of claim 15, wherein the thermoelectric module is to increase the thermal energy of the fluid in response to a second electrical signal traveling through the thermoelectric module in a second direction opposite the first direction.

17. The system of claim 16, further including processor circuitry to:
- cause transmission of the first electrical signal in response to at least one of a temperature of the fluid not satisfying a temperature threshold, a pressure of the fluid not satisfying a pressure threshold, or a period for which the electrical signal has been transmitted in the first direction not satisfying a time threshold; and
- cause transmission of the second electrical signal in response to at least one of the temperature of the fluid satisfying the temperature threshold, the pressure of the fluid satisfying the pressure threshold, or the period for which the electrical signal has been transmitted in the first direction satisfying the time threshold.

18. The system of claim 17, wherein the inlet is a first inlet and the conduit is a first conduit, wherein the fluid pump further includes a second inlet and an outlet, further including a second conduit in fluid connection with the second inlet and a third conduit in fluid connection with the outlet, wherein the first conduit is in fluid connection with at least one of the second conduit or the third conduit, the first conduit to define a flow path for fluid to flow from at least one of the second conduit or the third conduit to the first inlet.

19. The system of claim 18, further including:
a first valve positioned between the second conduit and the first conduit;
a second valve positioned between the third conduit and the first conduit; and
processor circuitry to:
  cause the first valve to at least partially open in response to a temperature of the fluid satisfying a temperature threshold; and
  cause the second valve to at least partially open in response to the temperature of the fluid not satisfying the temperature threshold.

20. An apparatus comprising:
means for pumping a first fluid;
means for transporting the first fluid fluidly coupled to the means for pumping;
means for returning the first fluid to the means for pumping the first fluid fluidly coupled to the means for transporting; and
means for adjusting a first thermal energy of the first fluid in the means for returning, the means for adjusting the first thermal energy of the first fluid including means for increasing the first thermal energy of the first fluid or a second thermal energy of a second fluid, the means for adjusting the first thermal energy of the first fluid including means for decreasing the first thermal energy of the first fluid or the second thermal energy of the second fluid; and
means for controlling the means for adjusting the first thermal energy of the first fluid, the means for controlling to cause the means for increasing the first thermal energy to be in contact with the means for returning in response at least one of a pressure of the first fluid not satisfying a pressure threshold or a temperature of the first fluid not satisfying a temperature threshold, the means for controlling to cause the means for decreasing the first thermal energy to be in contact with the means for returning in response to at least one of the pressure of the first fluid satisfying the pressure threshold or the temperature of the first fluid satisfying the temperature threshold.

* * * * *